United States Patent
Sin et al.

(10) Patent No.: US 9,761,545 B2
(45) Date of Patent: Sep. 12, 2017

(54) ISOLATOR AND METHOD OF MANUFACTURING ISOLATOR

(71) Applicant: FUJI ELECTRIC CO., LTD., Kawasaki-shi, Kanagawa (JP)

(72) Inventors: Johnny Kin On Sin, Kowloon (HK); Lulu Peng, Kowloon (HK); Rongxiang Wu, Kowloon (HK); Hitoshi Sumida, Kawasaki (JP); Yoshiaki Toyoda, Kawasaki (JP); Masashi Akahane, Kawasaki (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/201,369

(22) Filed: Jul. 1, 2016

(65) Prior Publication Data

US 2017/0005046 A1 Jan. 5, 2017

Related U.S. Application Data

(63) Continuation of application No. PCT/JP2015/003375, filed on Jul. 3, 2015.

(51) Int. Cl.
*H01L 21/00* (2006.01)
*H01L 23/64* (2006.01)
(Continued)

(52) U.S. Cl.
CPC ........ *H01L 23/645* (2013.01); *H01L 27/0694* (2013.01); *H01L 28/10* (2013.01);
(Continued)

(58) Field of Classification Search
CPC ..... H01L 23/645; H01L 23/64; H01L 23/481; H01L 28/10; H01L 27/0694;
(Continued)

(56) References Cited

U.S. PATENT DOCUMENTS

| 4,857,482 A | 8/1989 | Saito et al. |
| 5,519,582 A | 5/1996 | Matsuzaki |

(Continued)

FOREIGN PATENT DOCUMENTS

| JP | H06-120036 A | 4/1994 |
| JP | H08-32099 A | 2/1996 |

(Continued)

OTHER PUBLICATIONS

Wang, N., et al, "Thin Film Microtransformer Integrated on Silicon for Signal Isolation" (USA), IEEE Transactions on Magnetics, vol. 43, No. 6, Jun. 2007, pp. 2719-2721.

(Continued)

*Primary Examiner* — Nikolay Yushin
(74) *Attorney, Agent, or Firm* — Rabin & Berdo, P.C.

(57) ABSTRACT

An isolator is configured by a transmission circuit, a transformer, and a reception circuit. A first coil of the transformer is disposed on a back surface of a first semiconductor substrate; a transmission circuit and a second coil of the transformer are disposed on a front surface. The first coil is embedded within a coil trench, is led out through an embedded via-metal-film to a substrate front surface, and is electrically connected to the transmission circuit. The second coil is disposed on an insulating layer of the substrate front surface. The reception circuit is disposed on a front surface of a second semiconductor substrate. The second coil and the reception circuit are electrically connected to each other by connecting first and third electrode pads disposed respectively on the front surfaces of the first and second semiconductor substrates through wires.

18 Claims, 17 Drawing Sheets

(51) Int. Cl.
  *H01L 27/06*   (2006.01)
  *H01L 49/02*   (2006.01)
  *H01L 21/762*   (2006.01)

(52) U.S. Cl.
  CPC .. *H01L 21/762* (2013.01); *H01L 2224/48091* (2013.01); *H01L 2224/48137* (2013.01)

(58) Field of Classification Search
  CPC . H01L 21/76879; H01L 21/762; H01L 21/84; H01L 2224/48091; H01L 2224/48137
  See application file for complete search history.

(56) References Cited

U.S. PATENT DOCUMENTS

| | | | |
|---|---|---|---|
| 5,614,743 | A | 3/1997 | Mochizuki |
| 6,927,662 | B2 | 8/2005 | Kahlmann et al. |
| 7,417,301 | B2 | 8/2008 | Taghizadeh-Kaschani |
| 7,683,654 | B2 | 3/2010 | Chen et al. |
| 8,319,573 | B2 | 11/2012 | Kanschat et al. |
| 2004/0056749 | A1 | 3/2004 | Kahlmann et al. |
| 2005/0230837 | A1 | 10/2005 | Taghizadeh-Kaschani |
| 2007/0205855 | A1 | 9/2007 | Hashimoto |
| 2008/0061631 | A1 | 3/2008 | Fouquet et al. |
| 2010/0230783 | A1 | 9/2010 | Nakashiba |
| 2012/0020419 | A1 | 1/2012 | Kaeriyama |
| 2012/0068301 | A1 | 3/2012 | Sin et al. |
| 2013/0321094 | A1 | 12/2013 | Sumida et al. |

FOREIGN PATENT DOCUMENTS

| | | |
|---|---|---|
| JP | H08-97375 A | 4/1996 |
| JP | 2001-185685 A | 7/2001 |
| JP | 2007-067057 A | 3/2007 |
| JP | 2007-235035 A | 9/2007 |
| JP | 2011-112369 A | 6/2011 |
| WO | WO-2013/179333 A1 | 12/2013 |

OTHER PUBLICATIONS

Xu, M., et al, "A Microfabricated Transformer for High-Frequency Power or Signal Conversion" (USA), IEEE Transactions on Magnetics, vol. 34, No. 4, Jul. 1998, pp. 1369-1371.

Chen, B., "Isolated Half-Bridge Gate Driver with Integrated High-Side Supply" (Greece), IEEE Power Electronics Specialists Conference (PESC) 2008, Jun. 2008, pp. 3615-3618.

Kaeriyama, et al., "A 2.5kV Isolation 35kV/us CMR 250Mbps 0.13mA/Mbps Digital Isolator in Standard CMOS with an on-Chip Small Transformer" (USA), IEEE Symposium on VLSI Circuits (VLSIC) 2010, Jun. 2010, pp. 197-198.

Münzer, M., "Coreless Transformer a New Technology for Half Bridge Driver IC's" (Germany), International Exhibition and Conference for Power Electronics, Intelligent Motion and Power Quality (PCIM), May 2003.

Analog Devices, Inc., "Datasheet of ADuM1234 (Analog Devices Application Note)", 2007, pp. 1-10.

Infineon Technologies AG, "Datasheet of 2DE020112-FI (Infineon Technologies Application)", 2006.

Rongxiang Wu et al., "A Novel Silicon-Embedded Coreless Transformer for Isolated DC-DC Converter Application" (USA), IEEE 23rd International Symposium on Power Semiconductor Devices and ICs (ISPSD) 2011, May 2011, pp. 352-355.

Lulu Peng et al., "A Fully Integrated 3D TSV Transformer for High-Voltage Signal Transfer Applications", ECS Solid State Letters, vol. 2, No. 5, pp. Q29-Q31, Feb. 2013.

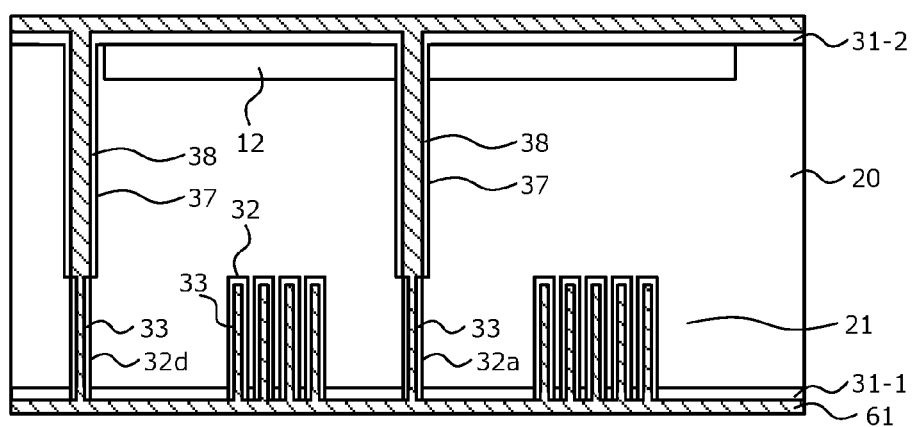
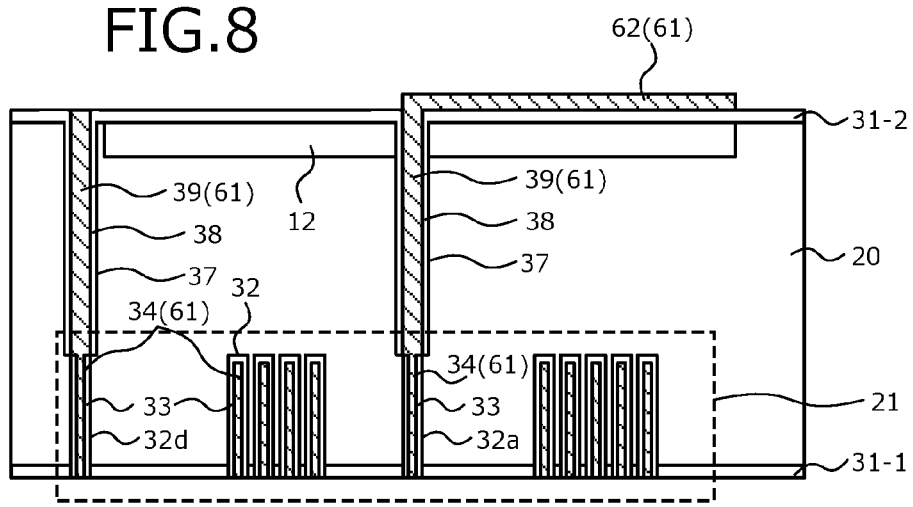
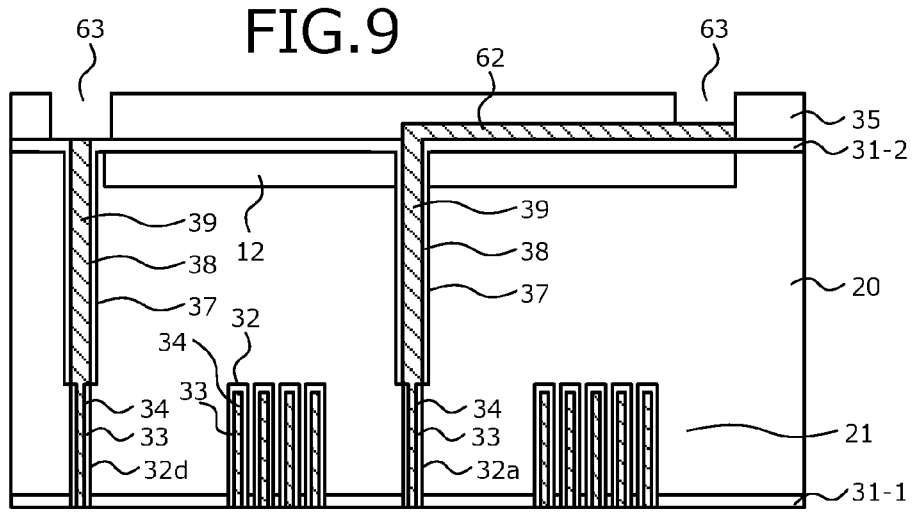

ISOLATOR AND METHOD OF MANUFACTURING ISOLATOR

CROSS REFERENCE TO RELATED APPLICATIONS

This non-provisional application is a continuation of International Application PCT/JP2015/003375, filed on Jul. 3, 2015, and designating the U.S., the entire contents of which are incorporated herein by reference.

BACKGROUND OF THE INVENTION

1. Field of the Invention

Embodiments of the present invention relate to an isolator and method of manufacturing an isolator.

2. Description of the Related Art

Various types of apparatuses, such as devices used for industrial or medical purposes, often require electrical insulation. For example, an electronic device controlled by high voltage is equipped with a signal isolator (isolator) so that when a signal received by the electronic device is conveyed to an external device or when the user directly manipulates the operation panel, the user is not subjected to electrical shock or other severe bodily harm. When the electric potential between electronic devices or circuit blocks is large, the isolator has a function of transferring (transmitting) a signal from a low voltage unit to a high voltage unit or from a high voltage unit to a low voltage unit, while current is interrupted (insulated).

For example, the high voltage unit and the low voltage unit are electrically isolated from each other by the isolator to prevent large current from flowing between the high voltage unit and the low voltage unit. Even when the electric potential between electronic devices or between circuit blocks is small and, for example, an analog circuit and a digital circuit are connected at a common reference potential, the analog circuit may be affected by digital noise. Therefore, by completely separating the reference potentials of the analog circuit and the digital circuit electrically by an isolator, digital noise may be prevented from being introduced at the analog circuit, enabling performance of the system to be improved.

Conventionally, signal isolating systems using a photocoupler that utilizes light as a signal transfer means are known as being among the most versatile isolators. The photocoupler has a structure incorporating a photodiode and a phototransistor in a single package, where light-dark changes in the light of the photodiode correspond to an input signal and are converted to voltage by the photo transistor to perform the electrically isolated signal transfer. Photocouplers have the advantages of a simple package configuration and high electrical isolation performance. On the other hand, photocouplers are devices that utilize light and therefore, cannot be fabricated by a general complementary metal oxide semiconductor (CMOS) technique and are mounted as a discrete component.

Further, the luminous efficiency of photodiodes configuring the photocoupler essentially degrades temporally consequent to operating conditions such as operating temperature and forward current. Therefore, when the life expectancy of a system equipped with the photocoupler is important, the setting of conditions such as operating temperature and forward current must be carefully considered. The photocoupler has a slow response speed and requires periods on the order of microseconds for signal transfer. As a result, for example, for an inverter drive system equipped with a photocoupler, the dead time of a device configured by the inverter must be established on the order of microseconds and therefore, increases in speed are not possible.

Coupling capacitors that utilize electric field changes consequent to capacitive coupling at the signal transfer means are known to be among the next highly versatile isolators after photocouplers. Since electric field changes are utilized for transferring a signal, the coupling capacitor interrupts direct current (DC) signals from a transmission circuit and transfers only alternating current (AC) signals to a reception circuit. Therefore, coupling capacitors are useful for separating the direct current voltage settings of a circuit network between the transmission circuit and the reception circuit. Coupling capacitors have the advantages of high insulation resistance and low power consumption. However, coupling capacitors have a problem of being easily affected by noise and external electric fields.

SUMMARY OF THE INVENTION

Transformers having two combined coils are additionally known as isolators. Such a transformer is a system that transfers signals by using magnetic field changes based on inductive coupling and typically includes a magnetic body such as ferrite between the two coils. However, despite having high insulation resistance and high resistance to noise, this transformer further has a high cost and high power consumption. Furthermore, the size of the coils themselves is large. Although transformers have been proposed that as compared to conventional transformers, have a smaller size and reduced implementation cost by using a print circuit board (PCB), low temperature co-fired ceramics (LTCC), and micro electro mechanical systems (MEMS), their size is still large.

Since the three isolators described above are discrete components, it is difficult to reduce the size of signal processing systems equipped with these isolators. Therefore, there is demand for an isolator that may be configured using a CMOS technique for fabricating the transmission circuit and the reception circuit and that may be mounted on the same semiconductor chip as the transmission circuit and the reception circuit. High voltage ICs (HVICs) are known as such isolators. An HVIC is an IC having a function of converting a signal for which the reference potential is set to the ground, into a signal of a different reference potential through a level shift circuit and may be formed on the same semiconductor chip as the transmission circuit and the reception circuit. Therefore, an HVIC has the advantage of enabling lower cost, lower power consumption, and a smaller size.

However, since an HVIC is a non-isolated system unable to transfer a signal while current is isolated, it is difficult to achieve higher breakdown voltages and with current techniques, rated breakdown voltage is limited to about 1200 V. Additionally, an HVIC has low noise resistance and thus, is easily damaged. Consequently, an HVIC is not applicable to an apparatus for which reliability is required. Thus, an isolator of an isolating system replacing the HVIC has become necessary. A digital isolator is known as an isolator of an insulation system that may be made monolithic with a CMOS circuit. A digital isolator is a transformer using two coils to utilize inductive coupling and is formed by using a series of processes for fabricating a CMOS circuit on the front surface or the back surface of the same semiconductor chip as the CMOS circuit. A magnetic body may be disposed between the two coils configuring the digital isolator.

For such a digital isolator, an isolator of an "on-silicon magnetic-core transformers" type (hereinafter, a first type) has been proposed that has a transformer configured by solenoid coils arranged in parallel and including a magnetic body such as ferrite inside (see, e.g., Wang, N., et al, "Thin Film Microtransformer Integrated on Silicon for Signal Isolation", (U.S.), IEEE Transactions on Magnetics, June 2007, Vol. 43, No. 6, pp. 2719-2721; and Xu, M., et al, "A Microfabricated Transformer for High-Frequency Power or Signal Conversion", (U.S.), IEEE Transactions on Magnetics, July 1998, Vol. 34, NO. 4, pp. 1369-1371). A digital isolator of the first type has a magnetic body between the coils and therefore, produces large inductance from a small area. However, since the coils have a three-dimensional pattern and a metal wire is processed into a spiral shape, the thickness of the metal wire cannot be increased. Therefore, the direct current resistance of the coils increases and the voltage gain decreases. Additionally, overcurrent arises resulting in large loss due to heat generation.

As a digital isolator without magnetic bodies, an isolator of an "on-silicon coreless transformers" type (hereinafter, a second type) has been proposed that has a transformer configured by two planar coils stacked on a semiconductor chip via an insulating film (see, e.g., U.S. Pat. No. 7,683,654; U.S. Pat. No. 6,927,662; U.S. Pat. No. 7,417,301; Chen, B. "Isolated Half-Bridge Gate Driver with Integrated High-Side Supply", (Greece), IEEE Power Electronics Specialists Conference (PESC) 2008, June 2008, pp. 3615-3618; Kaeriyama, S., et al, "A 2.5 kV isolation 35 kV/us CMR 250 Mbps 0.13 mA/Mbps Digital Isolator in Standard CMOS with an on-chip small transformer", (U.S.), IEEE Symposium on VLSI Circuits (VLSIC) 2010, June 2010, pp. 197-198; Munzer, M., et al, "Coreless transformer a new technology for half bridge driver IC's", (Germany), International Exhibition and Conference for Power Electronics, Intelligent Motion and Power Quality (PCIM)), May 2003; "Datasheet of ADuM1234, Analog Devices Application Note", Analog Devices, Inc., 2007, pp. 1-10; and "Datasheet of 2DE020I12-FI, Infineon Technologies Application Note", Infineon), 2006). In a digital isolator of the second type, since the coils are separated by the insulating film, the breakdown voltage may be increased by adjusting the thickness of the insulating film. Additionally, because of the absence of the magnetic bodies, the operation frequency is not limited by hysteresis. However, since the thickness of metal films configuring the coils cannot be increased, the direct current resistance of the coils is high and the voltage gain is low.

As another digital isolator without magnetic bodies, an isolator of a "silicon-embedded coreless transformers" type (hereinafter, a third type) has been proposed that has a transformer configured by two coils formed by embedding respective metal films via insulating films within two trenches having a planar spiral shape formed in a back surface of a semiconductor chip (see, e.g., U.S. Laid-Open Patent Publication No. 2012/0068301 and Wu, Rongxiang, et al, "A Novel Silicon-Embedded Coreless Transformer for Isolated DC-DC Converter Application", (U.S.), IEEE 23rd International Symposium on Power Semiconductor Devices and IC's (ISPSD) 2011, May 2011, pp. 352-355). In the digital isolator of the third type, since the area of the metal films forming the coils is determined by the depth of the trenches, the direct current resistance of the coils is low and large inductance may be achieved. Additionally, because of the absence of the magnetic bodies, the operation frequency is not limited by hysteresis. However, since the insulating films formed along trench inner walls cannot be thickened, it is difficult to increase the breakdown voltage. The coils oppose each other at the trench sidewalls in a direction (horizontal direction) parallel to a chip principal surface, making the area of the opposing portions larger. This leads to large parasitic capacitance between the coils and the primary-side coil is easily affected by the noise of the secondary-side coil.

As a digital isolator addressing the problems associated with the digital isolators of the first to third types, an isolator of a "silicon-embedded monolithic transformers" type (hereinafter, a fourth type) has been proposed that has a transformer configured by a primary-side coil formed by embedding a metal film via an insulating film inside a spiral trench formed on the back surface side of a semiconductor chip and a secondary-side coil created by forming a spiral metal film on an insulating layer deposited on the primary-side coil (see, e.g., U.S. Laid-Open Patent Publication No. 2013/0321094; and Peng, Lulu, et al, "A Fully Integrated 3D TSV Transformer for High-Voltage Signal Transfer Applications", ECS Solid State Letters, (U.S.), The Electrochemical Society, 2013, Vol. 2, No. 5, pp. 29-31).

In the digital isolator of the fourth type, since the primary-side coil is formed inside the trench so that the area may be made larger, the direct current resistance of the primary-side coil is reduced and higher voltage gain is achieved. The coils oppose each other in a direction orthogonal to the chip principal surface (a depth direction) and thus, the area of the opposing portions is small and the parasitic capacitance between the coils is small. This reduces the signal transfer delay time from the transmission circuit to the reception circuit and suppresses the occurrence of malfunction in the transmission circuit due to dV/dt (voltage variation) generated in the reception circuit. The breakdown voltage may be increased by increasing the thickness of the insulating layer between the coils. Further, since the coils are formed on the back surface side of the chip, circuits disposed on the front surface side of the chip are less affected by magnetic phenomena.

Digital isolators may be made monolithic by using CMOS techniques and such digital isolators are expected to be widely applied in industrial and medical fields and thus, are under active development. However, digital isolators of the first to third types have various problems as described above and the digital isolator of the fourth type addressing the problems of the isolators of the first to third types has the following problems. The digital isolator of the fourth type has a coil connected to a circuit disposed on a second semiconductor chip different from a first semiconductor chip on which the coil is disposed. On the back surface side of the first semiconductor chip, the coil is disposed along with a pad for connecting the coil to the circuit of the second semiconductor chip. Therefore, to connect the coil on the back surface side of the first semiconductor chip and the circuit of the second semiconductor chip, a bump (bump-shaped protrusion electrode) must be formed on the pad disposed on the back surface side of the first semiconductor chip to provide the first semiconductor chip as a flip chip, and the first semiconductor chip must be mounted (by wireless bonding) with the back surface facing downward on a wiring portion of a printed-circuit board, etc. Therefore, the assembly process for mounting the semiconductor chips in a single package becomes complicated, resulting in high mounting costs.

According to one aspect of the invention, an isolator includes a first coil disposed on a first principal surface side of a first semiconductor substrate. Further, a first circuit is disposed on a second principal surface side of the first semiconductor substrate. A second coil is disposed on the second principal surface side of the first semiconductor substrate, opposing the first coil across the first semiconductor substrate. A second circuit is disposed on a second principal surface side of a second semiconductor substrate. A transformer is disposed that is configured by the first coil and the second coil to transfer a signal between the first circuit and the second circuit from the first circuit to the second circuit or from the second circuit to the first circuit in an electrically isolated state.

In the isolator, the first coil is configured by a trench disposed in the first principal surface of the first semiconductor substrate, an oxide film disposed along a side wall and a bottom surface of the trench, and a first metal film embedded inside the oxide film within the trench.

In the isolator, a via hole reaching the trench from the second principal surface of the first semiconductor substrate; the oxide film disposed along a side wall of the via hole; and the first metal film embedded inside the oxide film within the via hole are provided. A signal from the first circuit or the second circuit is input through the first metal film within the via hole to the first coil.

In the isolator, an insulating layer is disposed on the second principal surface of the first semiconductor substrate to cover the first circuit. The second coil is configured by a second metal film disposed on the insulating layer.

In the isolator, the first circuit opposes the first coil and the second coil in a depth direction.

In the isolator, the first coil and the second coil have a planar spiral shape. In the first circuit, a circuit unit prone to malfunctioning consequent to at least magnetic flux of a coil opposes in the depth direction, the first coil and the second coil in a portion other than centers of spirals of the first coil and the second coil.

In the isolator, in the first circuit, the circuit unit prone to malfunctioning consequent to at least magnetic flux of a coil opposes the first coil and the second coil in the depth direction, at a position outward from innermost circumferences of the spirals of the first coil and the second coil.

In the isolator, in the first circuit, the circuit unit prone to malfunctioning consequent to at least magnetic flux of a coil opposes in the depth direction, a portion outward from the innermost circumferences and inward from outermost circumferences of the spirals of the first coil and the second coil.

In the isolator, the first semiconductor substrate on which the first circuit and the transformer are disposed and the second semiconductor substrate on which the second circuit is disposed are mounted on a single mounting substrate.

In the isolator, one of the first coil and the second coil is electrically connected by a wire to an electrode portion of the second circuit on the second principal surface side of the first semiconductor substrate.

In the isolator, the first circuit is a transmission circuit and the second circuit is a reception circuit. A signal from the first circuit is input to the first coil and input from the second coil through the wire to the second circuit.

In the isolator, the first circuit is a reception circuit and the second circuit is a transmission circuit. A signal from the second circuit is input to the second coil through the wire and input from the second coil to the first circuit.

In the isolator, the first metal film is a plated film.

In the isolator, the second metal film is a plated film.

According to one aspect of the present invention, method of manufacturing an isolator described above includes forming the first circuit on the second principal surface of the first semiconductor; forming a via hole in the second principal surface of the first semiconductor substrate; and forming a trench in the first principal surface of the first semiconductor substrate to connect the via hole and the trench. The method further includes forming an oxide film along a side wall of the via hole and a side wall and a bottom surface of the trench; and forming the first coil and a terminal of the first coil by embedding a first metal film inside the oxide film within the via hole and the trench such that the first metal film is exposed on the first principal surface and the second principal surface of the first semiconductor substrate. The method further includes forming an insulating layer on the second principal surface of the first semiconductor substrate to cover the first circuit; forming a second metal film to form the second coil on the surface of the insulating layer; and forming the second circuit on the second principal surface side of the second semiconductor substrate.

According to the method, the first metal film is embedded inside the oxide film within the via hole and the trench by a plating process.

According to the method, a mask is formed opened in a planar pattern of the second coil on a surface of the insulating layer. Subsequently, an opening portion of the mask is filled with the second metal film by a plating process; and the mask is removed.

According to the method, the first semiconductor substrate on which the first circuit and the transformer are formed and the second semiconductor substrate on which the second circuit is formed are mounted on a single mounting substrate.

According to the method, one of the first coil and the second coil is to electrically connected an electrode portion of the second circuit by wire on the second principal surface side of the first semiconductor substrate.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 7 is a cross-sectional view of the isolator according to the first embodiment during manufacturing;

FIG. 8 is a cross-sectional view of the isolator according to the first embodiment during manufacturing;

FIG. 9 is a cross-sectional view of the isolator according to the first embodiment during manufacturing;

DETAILED DESCRIPTION OF THE INVENTION

Figure 1:
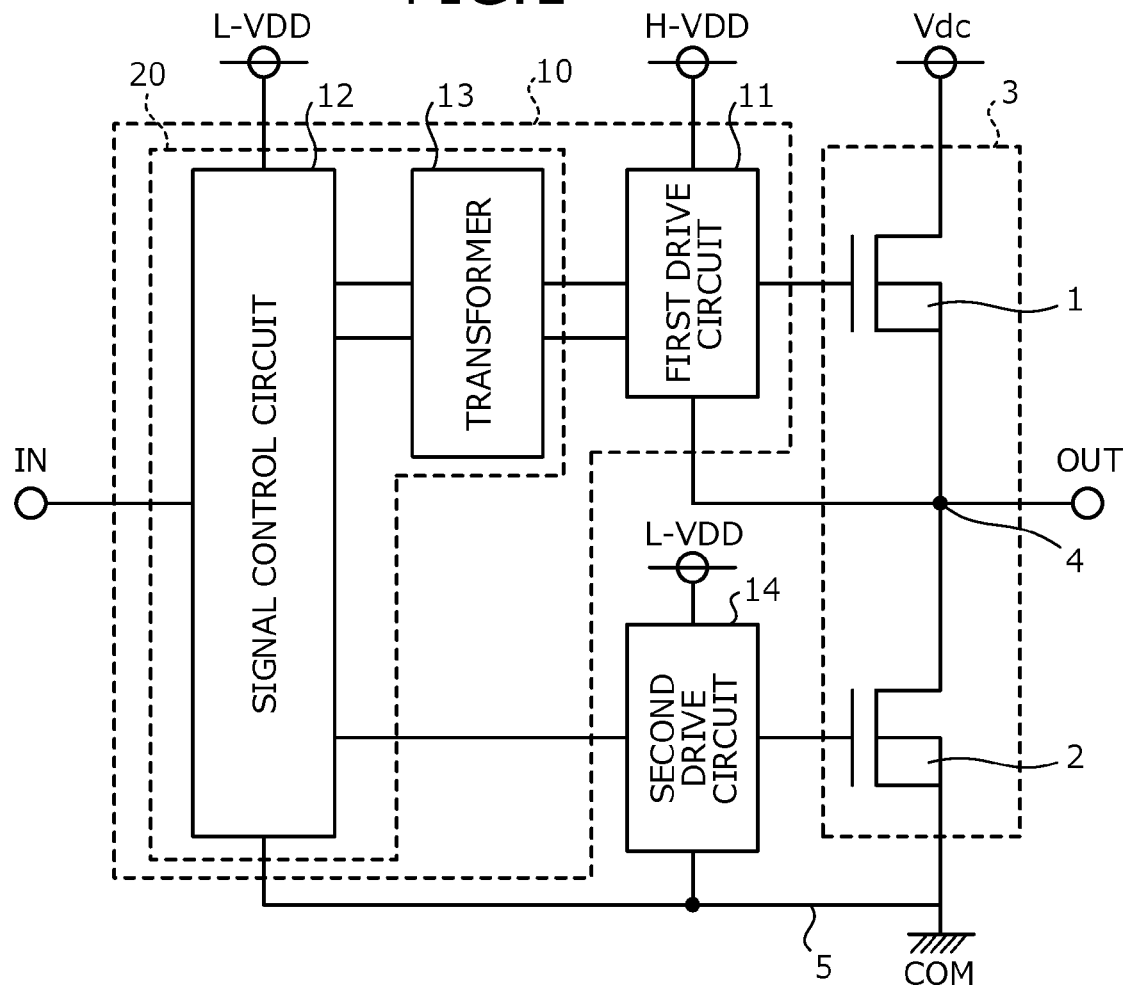
FIG. 1 is a block diagram depicting an example of overall configuration of a semiconductor apparatus to which an isolator according to a first embodiment is applied.

With reference to the accompanying drawings, embodiments of an isolator and an isolator manufacturing method according to the present invention will be described in detail. In the description and accompanying drawings, layers and/or areas indicated with "n" or "p", indicates that electrons or holes are the majority carriers, respectively. "+" or "−" appended to "n" or "p" indicates a relatively higher or a relatively lower impurity concentration as compared to the impurity concentration of a layer or area without "+" or "−" appended thereto. In the description of the embodiments and in the accompanying drawings hereinafter, identical components are given the same reference numerals and redundant description is omitted.

A semiconductor apparatus to which the isolator according to a first embodiment is applied will be described taking as an example, a drive circuit driving a metal-oxide-semiconductor field effect transistor (MOSFET) configuring a bridge circuit. FIG. 1 is a block diagram depicting an example of overall configuration of the semiconductor apparatus to which the isolator according to the first embodiment is applied. The semiconductor apparatus depicted in FIG. 1 is configured by a bridge circuit 3, an isolator 10 that includes a first drive circuit 11, and a second drive circuit 14. The bridge circuit 3 is configured by first and second MOSFETs 1, 2 connected in series and outputs signals to external device from an output terminal OUT connected to a connection point (hereinafter, a midpoint of the bridge circuit 3) 4 between a source of the first MOSFET 1 and a drain of the second MOSFET 2.

A drain of the first MOSFET 1 of an upper arm is connected to a voltage source Vdc of the bridge circuit 3. The source of the first MOSFET 1 is connected to the drain of the second MOSFET 2 of a lower arm. A gate of the first MOSFET 1 is connected to the first drive circuit 11 disposed upstream to the first MOSFET 1. The first MOSFET 1 is driven by a gate signal input from the first drive circuit 11. A source of the second MOSFET 2 is connected to a reference potential terminal COM having a potential lower than the midpoint 4 of the bridge circuit 3. The reference potential terminal COM is, for example, a grounding (ground) terminal. A gate of the second MOSFET 2 is connected to a second drive circuit 14 disposed upstream to the second MOSFET 2. The second MOSFET 2 is driven by a gate signal input from the second drive circuit 14.

The first drive circuit 11 is connected to a high-potential voltage source H-VDD using the midpoint 4 of the bridge circuit 3 as reference potential. The second drive circuit 14 is connected to the reference potential terminal COM via a reference potential line 5 and is connected to a low-potential voltage source L-VDD using the reference potential terminal COM as a reference. The isolator 10 is a digital isolator that transfers (transmits) digital signals to the bridge circuit 3 in an electrically isolated state and is configured by the first drive circuit 11, a signal control circuit 12, and a transformer 13. The signal control circuit 12 is disposed upstream to the first and second drive circuits 11, 14 and controls signals output to the first drive circuit 11 and the second drive circuit 14 based on a signal input from an input terminal IN. The first and second drive circuits 11, 14 are operated by the signals output from the signal control circuit 12.

The signal control circuit 12 is connected via the reference potential line 5 to the reference potential terminal COM and is connected to the low-potential voltage source L-VDD using the reference potential terminal COM as a reference. As a result, the signal control circuit 12 and the second drive circuit 14 has the same reference potential and therefore, a level shift function is not required between the signal control circuit 12 and the second drive circuit 14. On the other hand, since the signal control circuit 12 and the first drive circuit 11 have different reference potentials, the transformer 13 is inserted as a level shift circuit between the signal control circuit 12 and the first drive circuit 11. The transformer 13 implements a level shift (level-up) function of shifting the potential level of the signal from the signal control circuit 12 to the first drive circuit 11.

The transformer 13 is disposed between the signal control circuit 12 and the first drive circuit 11 and transfers the signal from the signal control circuit 12 to the first drive circuit 11 in an electrically isolated state. For example, the transformer 13 is configured by a primary-side coil and a secondary-side coil and uses magnetic field changes based on inductive coupling to transfer the signal from the signal control circuit 12 to the first drive circuit 11 in an electrically isolated state. The signal control circuit 12 and the transformer 13 are integrated to a same first semiconductor substrate (semiconductor chip) 20. In this case, the second drive circuit 14 may further be integrated to the first semiconductor substrate 20 along with the signal control circuit 12 and the transformer 13. On the other hand, the first drive circuit 11 is integrated to a second semiconductor substrate (semiconductor chip) different from the first semiconductor substrate 20. The transformer 13 and the first drive circuit 11 may be integrated to the same first semiconductor substrate 20 and the signal control circuit 12 may be integrated to the second semiconductor substrate.

Figure 2:
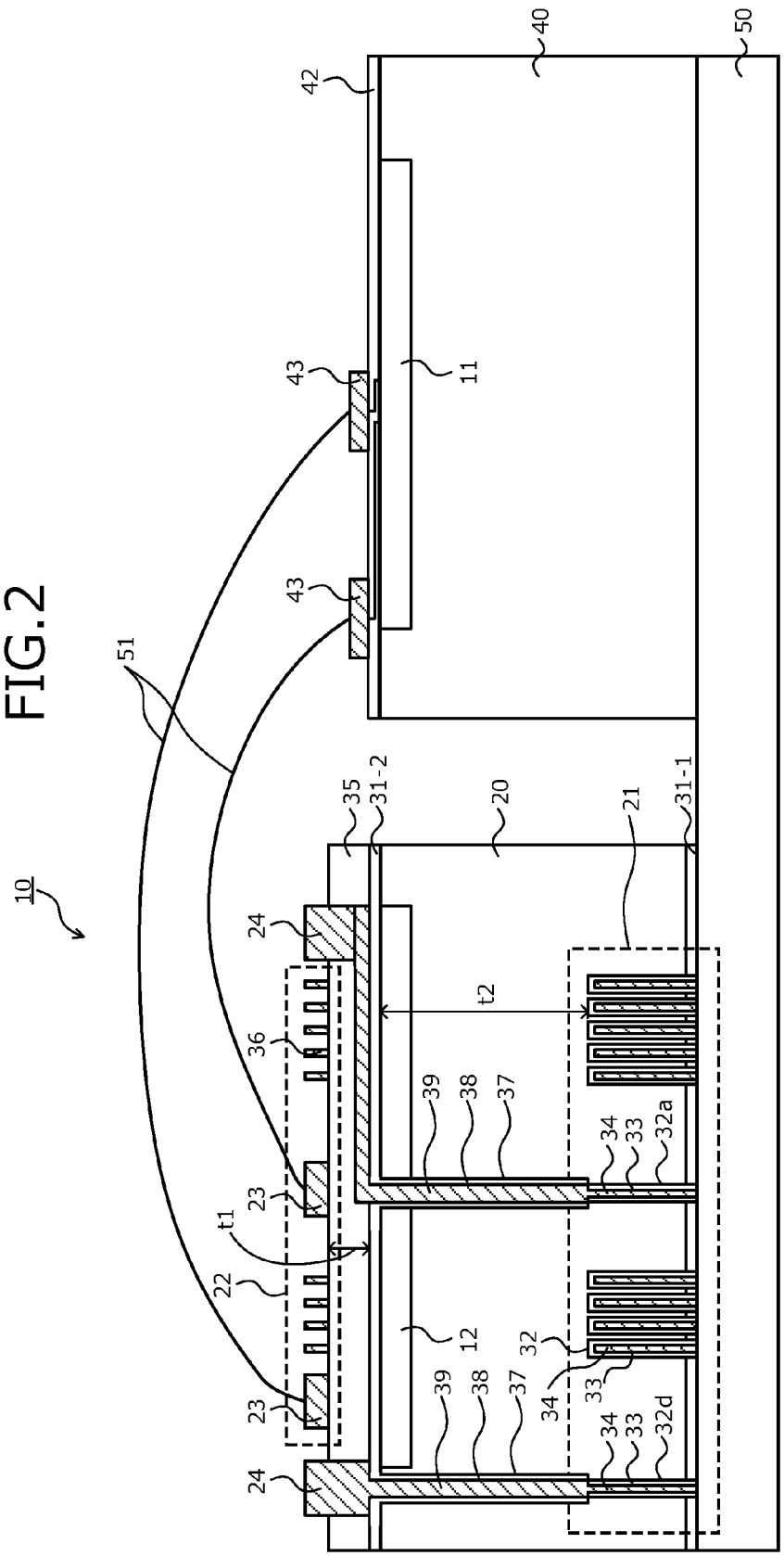
FIG. 2 is a schematic cross-sectional view of a portion of the semiconductor apparatus.
Figure 3:
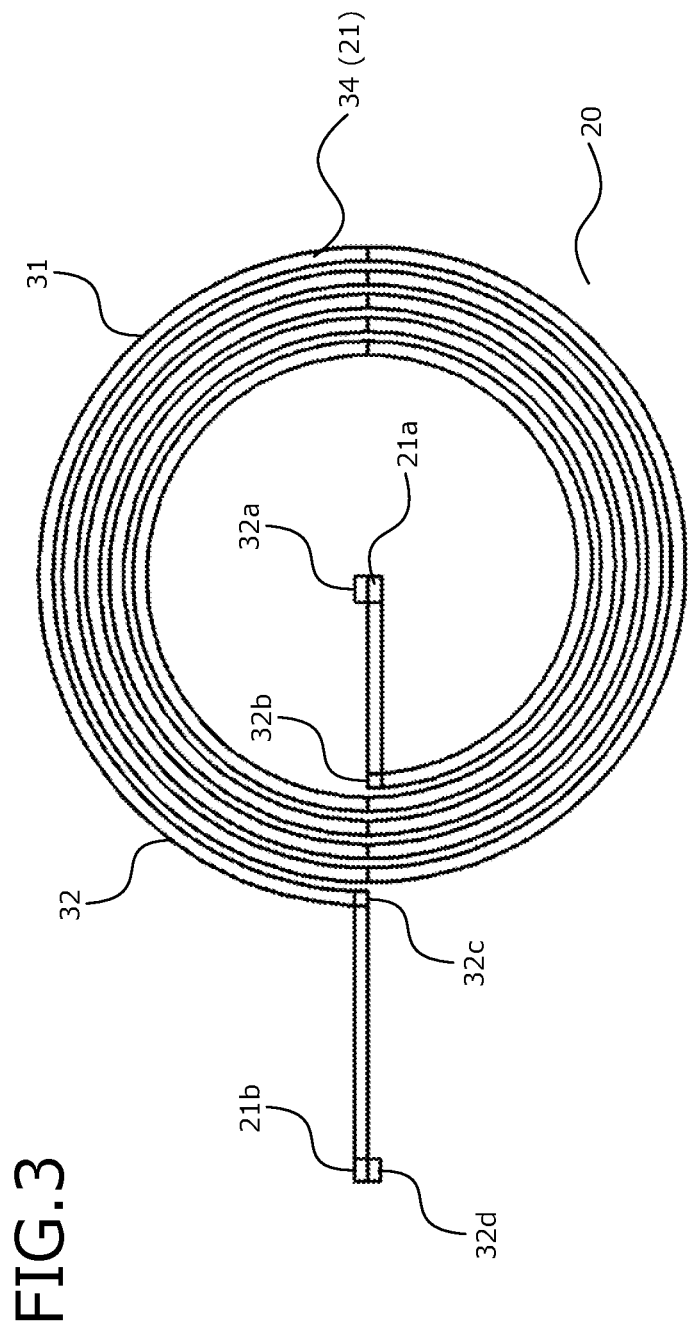
FIG. 3 is a plan view of a planar pattern of a trench forming a first coil of the isolator according to the first embodiment.

A cross-sectional configuration of the isolator 10 will be described by taking as an example, a case of integrating the signal control circuit 12 and the transformer 13 to the same first semiconductor substrate 20 and integrating the first drive circuit 11 to the second semiconductor substrate. FIG. 2 is a schematic cross-sectional view of a portion of the semiconductor apparatus to which the isolator according to the first embodiment is applied. In FIG. 2, sealing resin and the case of the package are not depicted (the same applies to FIGS. 16 to 18). FIG. 3 is a plan view of a planar pattern of a trench forming a first coil of the isolator according to the first embodiment. FIG. 3 depicts a planar pattern of a trench 32 viewed from the back surface of the first semiconductor substrate 20 without depicting an insulating film 33 disposed along the inner wall of the trench 32. As depicted in FIG. 2, the isolator 10 according to the first embodiment is a package in which the first and second semiconductor substrates 20, 40 made of silicon (Si) are mounted on a mounting substrate 50 such as a printed circuit board, for example.

A first coil 21 is disposed on the back surface (first principal surface) side of the first semiconductor substrate 20 and, the signal control circuit (first circuit) 12 and a second coil 22 are disposed on the front surface (second principal surface) side. The transformer 13 is configured by the first coil 21 and the second coil 22 formed by spirals of predetermined numbers of turns. The reception circuit (second circuit) 11 is disposed on the front surface side of the second semiconductor substrate 40. The first and second semiconductor substrates 20, 40 are mounted on the mounting substrate 50 with the respective back surfaces facing downward. The signal control circuit 12 includes a common device structure (not depicted) such as a MOSFET, for example. A basic circuit unit of the signal control circuit 12 is configured by, for example, a transmission circuit (not depicted) for transmitting a signal to the reception circuit 11. The reception circuit 11 is a circuit unit to which the signal from the signal control circuit 12 is input, and corresponds to the first drive circuit 11. The signal control circuit 12 and the first drive circuit 11 will hereinafter be described as the transmission circuit 12 and the reception circuit 11, respectively.

For example, oxide films 31-1 and 31-2 are disposed on the back surface and the front surface, respectively, of the first semiconductor substrate 20. The oxide films 31-1, 31-2 may be low temperature oxide (LTO) films, for example. The oxide films 31-1, 31-2 are used as etching masks for forming trenches 32, 37 described later, for example. The trench 32 is disposed in one continuous substantially circular spiral (spiral) planar pattern around a predetermined point defined as a center 32a on the back surface of the first semiconductor substrate 20 (see FIG. 3). The trench 32 has a start point 32b of the spiral at a position away from the center 32a of the spiral and forms a planar pattern spiraling at almost equal intervals into a substantially circular shape in a direction away from the center 32a of the spiral. Therefore, a portion (a semiconductor unit) surrounded by the trench 32 forms a substantially circular planar pattern.

Additionally, for example, the trench 32 extends substantially linearly from the start point 32b of the spiral to the center (hereinafter, an inner end portion of the trench 32) 32a of the spiral and extends substantially linearly from an end point 32c of the spiral to an outer predetermined point (hereinafter, an outer end portion of the trench 32) 32d. Therefore, the trench 32 forms a planar pattern having a spiral portion and respective substantially linear portions extending from the start point 32b and the end point 32c of the spiral. The trench 32 may form a planar pattern spiraling into a substantially rectangular shape, a substantially elliptical shape, or a race track shape (a shape having a set of opposite sides protruding outward into an arc shape). The insulating film 33 is disposed within the trench 32 along the inner wall of the trench 32 and a first metal film 34 is formed inside the insulating film 33. The first metal film 34 forms a planar pattern having a spiral portion and respective substantially linear portions extending from the start point and the end point of the spiral as is the case with the trench 32. The first metal film 34 embedded within the trench 32 is the first coil 21.

An inner end portion 21a and an outer end portion 21b of the first coil 21 are located at the same positions as the inner end portion 32a and the outer end portion 32d, respectively, of the trench 32. Each of the inner and outer end portions 21a and 21b of the first coil 21 is led out to the substrate front surface side through a metal film (hereinafter, an embedded via-metal-film) 39 in a trench (hereinafter, via trench) 37 described later and is electrically connected to the transmission circuit 12. The insulation resistance between the adjacent spiral lines of the first coil 21 may be ensured by the insulating film 33 disposed on the side wall of the trench 32. The resistance from the windings of the first coil 21 may be reduced by increasing the cross-sectional area of the first metal film 34 on the side wall of the trench 32. Therefore, the thickness of the first semiconductor substrate 20 may be changed such that a predetermined depth of the trench 32 is acquired while a predetermined breakdown voltage rate is obtained, for example.

The transmission circuit 12 having a predetermined device structure is disposed on the front surface side of the first semiconductor substrate 20. On the front surface side of the first semiconductor substrate 20, the oxide film 31-2 and an insulating layer 35 are disposed in this order to cover the transmission circuit 12, and a second metal film 36 is formed on the insulating layer 35. For example, the insulating layer 35 may be made of a material such as benzocyclobutene (BCB), silicon nitride (SiN), photosensitive epoxy resin (SU8), or silicon oxide ($SiO_2$). The second metal film 36 is disposed in one continuous substantially circular spiral planar pattern around a predetermined point defined as a center. For example, the second metal film 36 has a start point of the spiral at a position away from the center of the spiral and forms a planar pattern spiraling at almost equal intervals into a substantially circular shape in a direction away from the center of the spiral as is the case with the first metal film 34. The second metal film 36 may form a planar pattern spiraling into a substantially rectangular shape, a substantially elliptical shape, or a race track shape.

The second metal film 36 extends substantially linearly from the start point of the spiral to the center as is the case with the first metal film 34. The second metal film 36 may extend substantially linearly from an end point of the spiral to an outer predetermined point as is the case with the first metal film 34. The second metal film 36 is disposed to have a thickness of about a few micrometers and therefore, may be formed by using a common CMOS technique. The second metal film 36 disposed on the insulating layer 35 is the second coil 22. The second coil 22 is disposed to oppose the first coil 21, across the insulating layer 35 and the first semiconductor substrate 20. The first coil 21 and the second coil 22 are electrically isolated by the insulating layer 35 on the substrate front surface. A coupling capacitance between the first coil 21 and the second coil 22 may be reduced by increasing a thickness t1 of the insulating layer 35 and a thickness t2 from the front surface of the first semiconductor substrate 20 to the bottom surface of the trench (hereinafter, coil trench) 32 on the substrate back surface side.

The second coil 22 may be disposed on the transmission circuit 12 via the oxide film 31-2 and the insulating layer 35. Therefore, the transmission circuit 12 may be disposed to be between the first coil 21 and the second coil 22 because the chip size may be reduced by further increasing the area in which the first coil 21 and the second coil 22 overlap with the transmission circuit 12 in the depth direction. A preferable position of the transmission circuit 12 in a direction parallel to the substrate front surface (horizontal direction) will be described later. An inner end portion (i.e., the center of the spiral) and an outer end portion (i.e., an end point of the spiral or a predetermined point substantially linearly extended outward from the end point) of the second coil 22 act as first electrode pads 23 serving as terminals of the second coil 22.

The first semiconductor substrate 20 is disposed with the two via trenches 37 having a depth reaching the coil trench 32 from the front surface. The via trenches 37 are via holes for leading out the first coil 21 disposed on the substrate back surface side to the substrate front surface side. The two via trenches 37 are respectively connected to the inner end portion 32a and the outer end portion 32d of the coil trench 32. Insulating films 38 are disposed within the via trenches 37 along the side walls of the via trenches 37, and embedded via-metal-films 39 are disposed inside the insulating films 38. The insulating films 38 continue to the insulating film 33 of the side wall of the coil trench 32 at connecting portions between the via trenches 37 and the coil trench 32. The two embedded via-metal-films 39 are electrically isolated from each other by the insulating films 38.

The embedded via-metal-films 39 are terminals of the first coil 21. The two embedded via-metal-films 39 are respectively connected to the inner end portion 21a and the outer end portion 21b of the first coil 21 at the coupling portions between the via trenches 37 and the coil trench 32 and are electrically connected to electrode portions of the transmission circuit 12 at portions not depicted on the substrate front surface side. The embedded via-metal-films 39 are further connected to second electrode pads 24 described later. The embedded via-metal-films 39 may be extended from the inside of the via trenches 37 between the oxide film 31-2 and the insulating layer 35 such that the portion of the embedded via-metal-films 39 extending between the oxide film 31-2 and the insulating layer 35 is used as underpass wiring for connection to the second electrode pads 24. By disposing the underpass wiring in the embedded via-metal-films 39, the first coil 21 may be led out at predetermined positions on the substrate front surface side.

For example, the embedded via-metal-film 39 connected to the inner end portion 21a of the first coil 21 is opposite to the inner end portion of the second coil 22 in the depth direction. By extending the embedded via-metal-film 39 connected to the inner end portion 21a of the first coil 21 between the oxide film 31-2 and the insulating layer 35, the first coil 21 may be led outside the second coil 22 on the substrate front surface side. FIG. 2 depicts a configuration having the embedded via-metal-film 39 connected to the inner end portion 21a of the first coil 21 and provided with the underpass wiring. The second electrode pads 24 are connected to the embedded via-metal-films 39 via contact holes penetrating the insulating layer 35 in the depth direction. The second electrode pads 24 are used as test electrode pads for a characteristic test of a semiconductor apparatus, for example. The second electrode pads 24 may be omitted.

The reception circuit 11 having a predetermined device structure is disposed on the front surface side of the second semiconductor substrate 40. On the front surface side of the second semiconductor substrate 40, an oxide film 42 is disposed to cover the reception circuit 11, and two third electrode pads 43 are arranged on the oxide film 42. The third electrode pads 43 are terminals connected to electrode portions of the reception circuit 11. The third electrode pads 43 and the first electrode pads 23 are electrically connected by bonding wires 51. Therefore, a signal from the transmission circuit 12 is input to the first coil 21 and is input from the second coil 22 via the bonding wires 51 to the reception circuit 11. The reception circuit 11 and the first MOSFET 1 of the upper arm of the bridge circuit 3 are electrically connected by wiring not depicted on the substrate front surface. The first electrode pads 23 acting as the terminals of the second coil 22 and the third electrode pads 43 acting as the terminals of the reception circuit 11 are disposed on the front surfaces of the first and second semiconductor substrates 20 and 40, respectively. This eliminates the need to dispose bump electrodes on the back surfaces of the first and second semiconductor substrates 20, 40, and the first and second semiconductor substrates 20, 40 may be mounted easily on the mounting substrate 50. The first electrode pads 23 and the third electrode pads 43 may be electrically connected by a simple low-cost process such as wire bonding.

Figure 4:
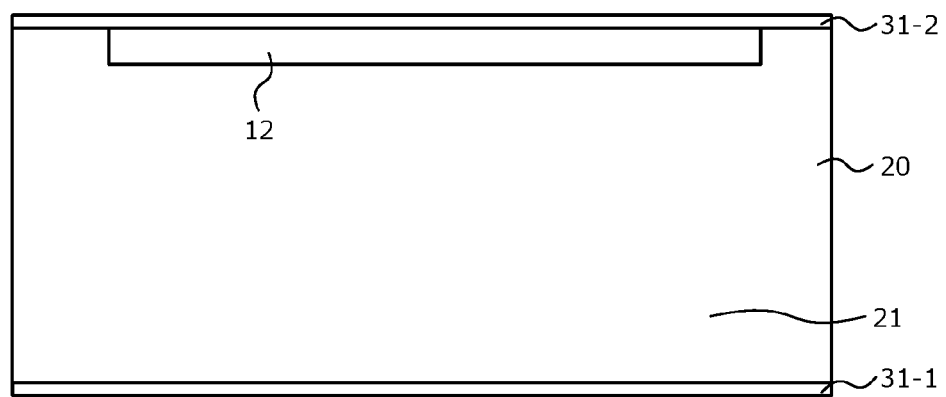
FIG. 4 is a cross-sectional view of the isolator according to the first embodiment during manufacturing.

An isolator manufacturing method 10 according to the first embodiment will be described. FIGS. 4 to 12 are cross-sectional views of the isolator according to the first embodiment during manufacturing. First, as depicted in FIG. 4, for example, the p-type first semiconductor substrate 20 is made of silicon with a <100> plane defined as the front surface. The transmission circuit 12 is formed on the front surface of the first semiconductor substrate 20 by a common IC process. The back surface of the first semiconductor substrate 20 is polished to reduce the thickness of the first semiconductor substrate 20 to about 300 micrometers, for example. The first semiconductor substrate 20 may be made thinner before forming the transmission circuit 12 on the front surface of the first semiconductor substrate 20. The specific resistance of the first semiconductor substrate 20 may be selected according to the configuration of the device configuring the transmission circuit 12. The thickness of the first semiconductor substrate 20 may be changed according to the depth of the coil trench 32 formed at a subsequent process.

Figure 5:
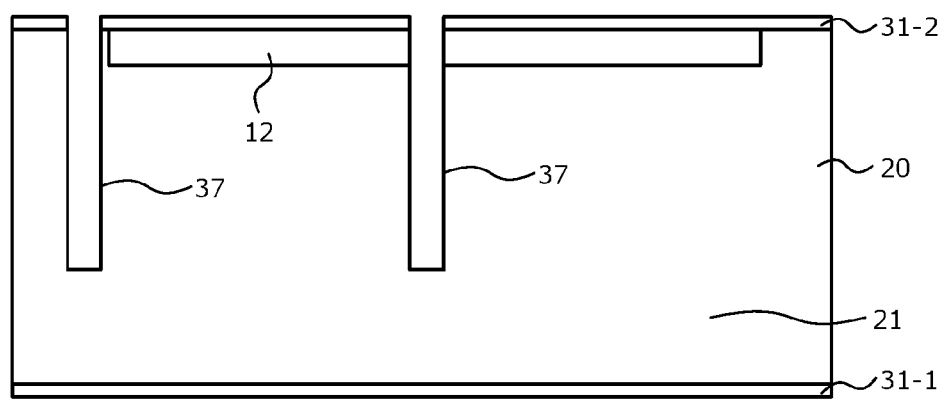
FIG. 5 is a cross-sectional view of the isolator according to the first embodiment during manufacturing.
Figure 6:
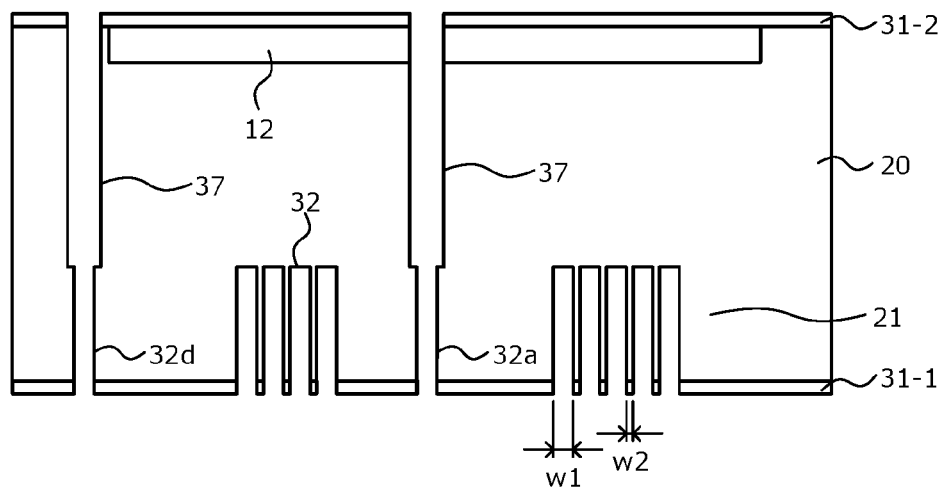
FIG. 6 is a cross-sectional view of the isolator according to the first embodiment during manufacturing.

For example, the oxide films 31-2, 31-1 such as LTO films are deposited on the front surface and the back surface, respectively, of the first semiconductor substrate 20 to, for example, a thickness of about 2 micrometers or more to 3 micrometers or less. As depicted in FIG. 5, the oxide film 31-2 formed on the front surface of the first semiconductor substrate 20 is patterned by photolithography to expose portions of the front surface of the first semiconductor substrate 20 corresponding to the formation regions of the via trenches 37. The remaining portion of the oxide film 31-2 is used as a mask for etching to form the two via trenches 37 in the front surface of the first semiconductor substrate 20. The via trenches 37 may be, for example, about 150 micrometers or more to 250 micrometers or less deep and may be, for example, about 25 micrometers or more to 35 micrometers or less wide. As depicted in FIG. 6, the oxide film 31-1 formed on the back surface of the first semiconductor substrate 20 is patterned by photolithography to expose portions of the back surface of the first semiconductor substrate 20 corresponding to the formation region of the coil trench 32.

The remaining portion of the oxide film 31-1 is used as a mask for etching to form the coil trench 32 in the back surface of the first semiconductor substrate 20. As a result, the coil trench 32 is formed into one continuous spiral planar pattern. The inner end portion 32a and the outer end portion 32d of the coil trench 32 are connected to the respective via trenches 37, and the trenches penetrating from the front surface to the back surface of the first semiconductor substrate 20 are formed at the inner end portion 32a and the outer end portion 32d of the coil trench 32. The depth of the coil trench 32 may be, for example, about 10 micrometers or more to 150 micrometers or less. In the case of the thickness of the first semiconductor substrate 20 described above, the depth of the coil trench 32 may be, for example, 50 micrometers. A width w1 of the coil trench 32 may be, for example, about 10 micrometers or more to 30 micrometers or less. An interval w2 between adjacent spiral lines of the coil trench 32 may be, for example, about 5 micrometers or more to 10 micrometers or less. The via trenches 37 may be formed after the coil trench 32 is formed.

As depicted in FIG. 7, for example, oxide films such as LTO films are newly deposited (formed) on the front and back surfaces of the first semiconductor substrate 20, the side wall and the bottom surface of the coil trench 32, and the side walls of the via trenches 37. At the connecting portions between the coil trench 32 and the via trenches 37, the oxide films are deposited from the side walls of the coil trench 32 over to the side walls of the via trenches 37. As a result, the oxide films 31-2, 31-1 on the front and back surfaces of the first semiconductor substrate 20 are increased in thickness, and the oxide films acting as the insulating films 33, 38 are formed along the side wall and the bottom surface of the coil trench 32 and the side walls of the via trenches 37. A barrier metal is formed by, for example, a sputtering method on the oxide films 31-2, 31-1 of the front and back surfaces of the first semiconductor substrate 20, the insulating film 33 of the side wall and the bottom surface of the coil trench 32, and the insulating films 38 of the side walls of the via trenches 37. This barrier metal is formed by sequentially depositing a tungsten (W) film having a thickness of about 100 nm and a copper (Cu) film having a thickness of about 2 micrometers, for example.

Electroplating is performed to increase the thickness of the copper film formed on the front and back surfaces of the first semiconductor substrate 20, the side wall and the bottom surface of the coil trench 32, and the side walls of the via trenches 37. The copper film of the barrier metal deposited before this electroplating forms a seed layer in the electroplating. As a result of this electroplating, the copper film is embedded within the coil trench 32 and the via trenches 37. In this way, a layered metal film (first metal film) 61 configured by the tungsten film and the copper film is formed on the front and back surfaces of the first semiconductor substrate 20 and within the coil trench 32 and the via trenches 37. To completely embed the copper film within the coil trench 32 and the via trenches 37, the electroplating may be performed for a sufficient length of time. For example, by performing the electroplating for a sufficient length of time, the copper film is deposited on the front and back surfaces of the first semiconductor substrate 20 to a thickness of a little more than 10 micrometers. The layered metal film 61 may be made of a metal material other than copper. The layered metal film 61 may be formed by sputtering alone.

As depicted in FIG. 8, the layered metal film 61 on the back surface of the first semiconductor substrate 20 is completely removed to expose the oxide film 31-1 by a chemical mechanical polishing (CMP) method, for example. As a result, the layered metal film 61 remains within the coil trench 32. The layered metal film 61 remaining within the coil trench 32 forms the first coil 21 (a portion surrounded by a dashed line in FIG. 8). The layered metal film 61 on the front surface of the first semiconductor substrate 20 is removed to a desired thickness by the CMP method, for example. The layered metal film 61 on the front surface of the first semiconductor substrate 20 is then selectively removed by photolithography and etching. The layered metal film 61 is left within the via trenches 37 while the layered metal film 61 is left on the oxide film 31-2 in a predetermined pattern to extend from the inside of one of the via trenches 37 onto the oxide film 31-2. This layered metal film 61 forms the embedded via-metal-films 39. The layered metal film 61 remaining on the oxide film 31-2 forms underpass wiring 62 for connection to the electrode pad 24 formed in a subsequent process. Here, configuration is depicted in which the embedded via-metal-film 39 connected to the inner end portion 21a of the first coil 21 is provided with the underpass wiring 62.

As depicted in FIG. 9, the insulating layer 35 such as a BCB film is deposited on the front surface of the first semiconductor substrate 20 to a thickness of about 10 micrometers, for example. The insulating layer 35 is formed by a plasma-enhanced chemical vapor deposition (PECVD) method or a spin coating method, for example. A thickness t2 of the insulating layer 35 is determined according to the insulation breakdown voltage between the first coil 21 and the second coil 22. For example, by depositing the insulating layer 35 to a thickness of about 10 micrometers, breakdown voltage of about 3000 V is established. The insulating layer 35 is then selectively removed by photolithography and etching to form contact holes 63 and expose the embedded via-metal-films 39. FIG. 9 depicts, for example, an exposed state of an end portion of the underpass wiring 62 of the embedded via-metal-film 39 connected to the inner end portion 21a of the first coil 21 and an upper end portion (an end portion on the substrate front surface side) of the embedded via-metal-films 39 connected to the outer end portion 21b of the first coil 21.

Figure 10:
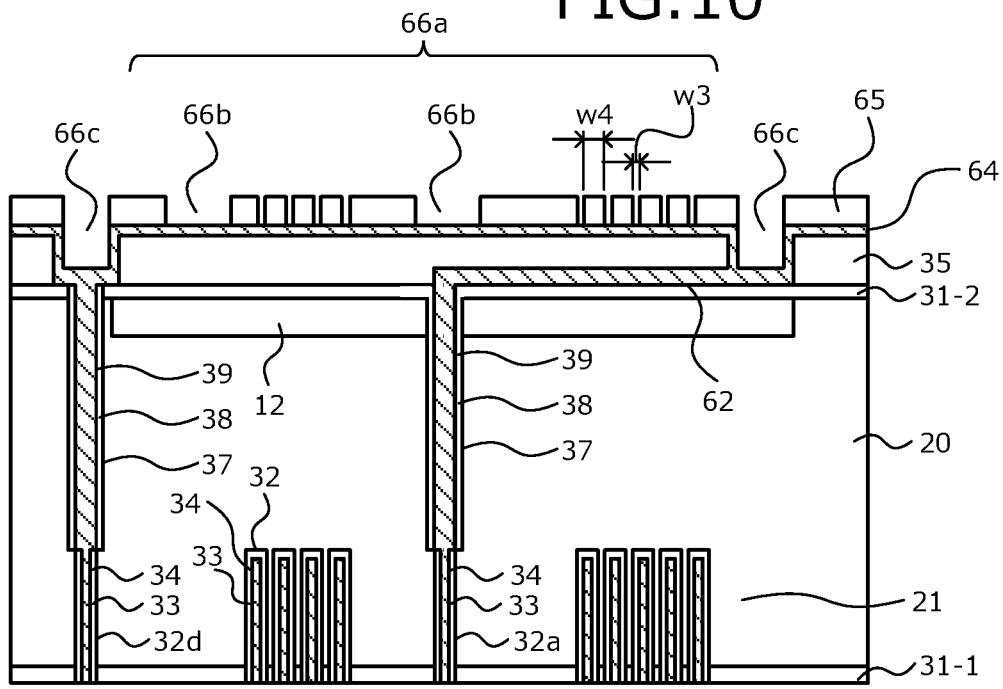
FIG. 10 is a cross-sectional view of the isolator according to the first embodiment during manufacturing.

As depicted in FIG. 10, a layered metal film 64 is deposited on the surface of the insulating layer 35 and the side walls of the contact holes 63 by, for example, the sputtering method. The layered metal film 64 is formed by sequentially depositing a tungsten film having a thickness of about 100 nm and a copper film having a thickness of 500 nm, for example. A resist mask 65 having openings at portions corresponding to the formation region of the second coil 22 and the formation regions of the first and second electrode pads 23, 24 is formed on the surface of the layered metal film 64 to a thickness of about 5 micrometers, for example. In the formation region of the second coil 22, an opening portion 66a is formed into the one continuous spiral planar pattern described above. A width w3 of the opening portion 66a of the formation region of the second coil 22 may be, for example, 10 micrometers or more to 30 micrometers or less and an interval w4 between adjacent spiral lines of the opening portion 66a may be, for example, about 5 micrometers or more to 10 micrometers or less. In the opening portion 66a of the formation region of the second coil 22, opening portions 66b defined as the start and end points of the spiral are formation regions of the first electrode pads 23. For example, substantially rectangular opening portions 66c are formed in the formation regions of the second electrode pads 24.

Figure 11:
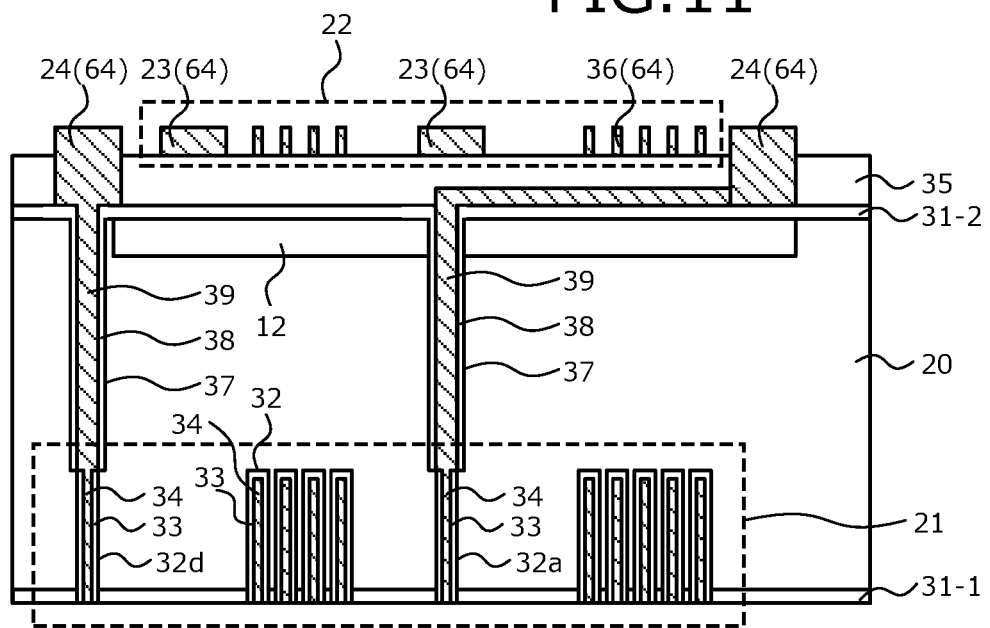
FIG. 11 is a cross-sectional view of the isolator according to the first embodiment during manufacturing.

As depicted in FIG. 11, electroplating is performed to increase the thickness of the copper film of the layered metal film 64 (second metal film) exposed in the opening portions 66a to 66c of the resist mask 65. The copper film of the layered metal film 64 deposited before this electroplating process forms a seed layer for the electroplating. As a result of the electroplating, the opening portions 66a to 66c of the resist mask 65 are filled with the copper film. Therefore, the thickness of the copper film deposited by the electroplating process is on the same order as the thickness of the resist mask 65. As a result, the second coil 22 configured by the layered metal film 64 is formed in the opening portion 66a of the resist mask 65, and the first and second electrode pads 23, 24 configured by the layered metal film 64 is formed in the opening portions 66b, 66c of the resist mask 65. After the resist mask 65 is removed, only a thin thickness portion used as the seed layer of the layered metal film 64 and exposed by removal of the resist mask 65 is removed by etching etc. As a result, a short (short circuit) may be prevented between the adjacent spiral lines of the second coils 22 and between the second coil 22 and the second electrode pads 24. Aluminum (Al) or metal containing aluminum may be used instead of copper as a metal material of the second coil 22 and the first and second electrode pads 23, 24. The second coil 22 and the first and second electrode pads 23, 24 may be formed by the sputtering method alone without the electroplating process.

Figure 12:
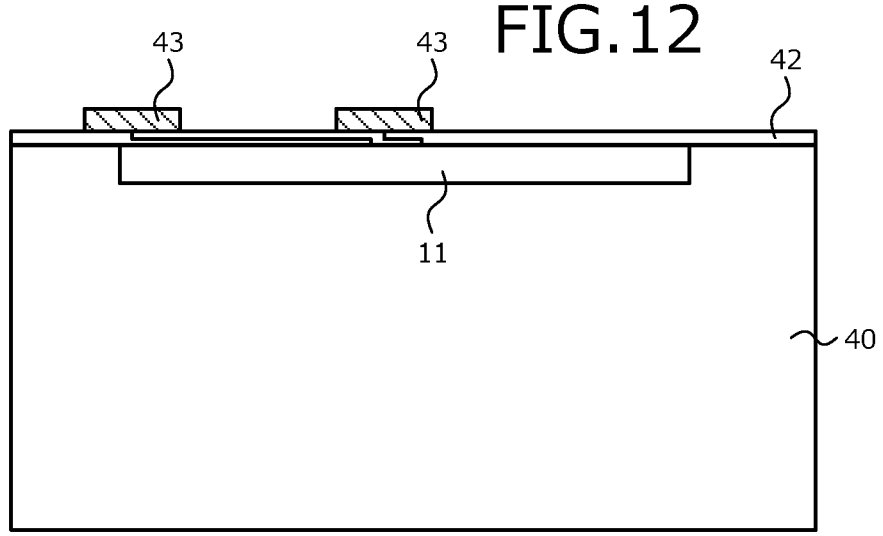
FIG. 12 is a cross-sectional view of the isolator according to the first embodiment during manufacturing.

As depicted in FIG. 12, for example, the p-type second semiconductor substrate 40, which is made of silicon with a <100> plane defined as the front surface, is prepared. The reception circuit 11 is formed on the front surface side of the second semiconductor substrate 40 by a common IC process. For the reception circuit 11, the two third electrode pads 43 are formed on the front surface of the second semiconductor substrate 40 via the oxide film 42. The first and second semiconductor substrates 20, 40 are disposed on the mounting substrate 50 with the respective back surfaces facing downward. Subsequently, the first electrode pads 23 and the third electrode pads 43 are electrically connected by bonding wires 51 made of copper, gold (Au), or aluminum to complete the isolator 10 depicted in FIG. 2.

Figure 13:
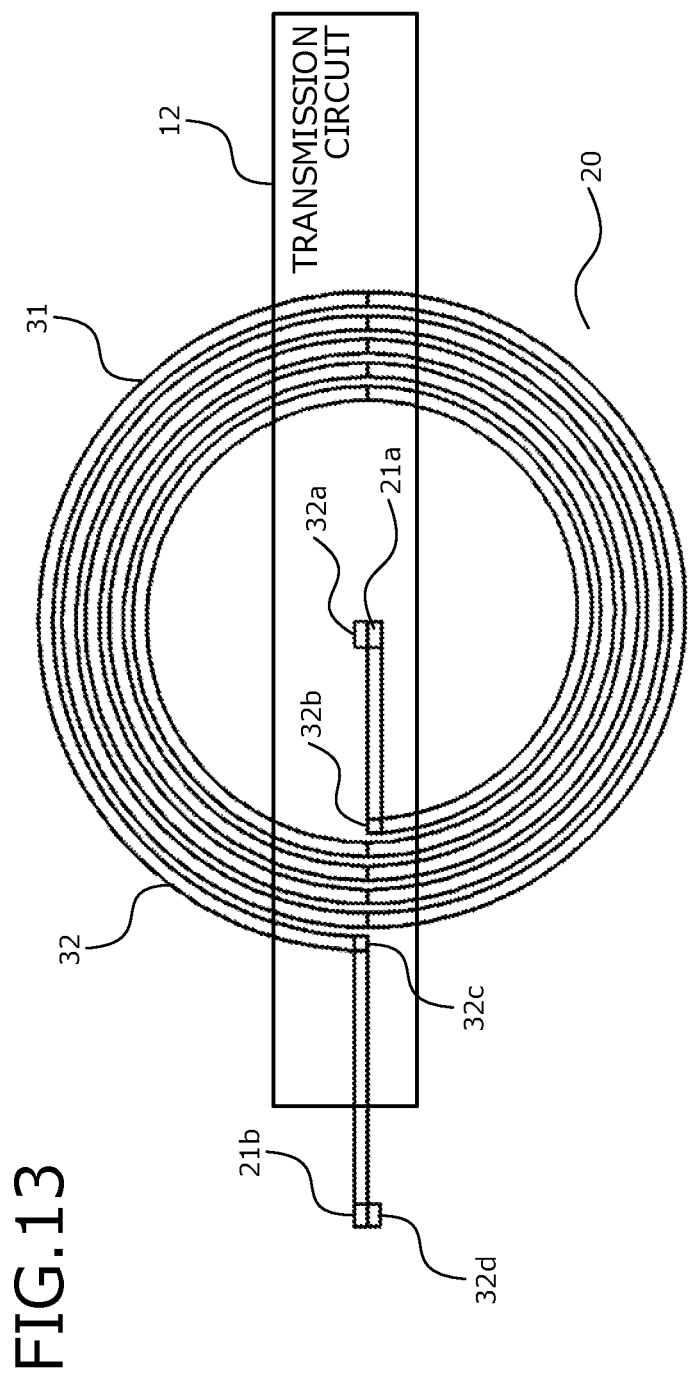
FIG. 13 is a schematic plan view of a horizontal position of a transmission circuit disposed on the isolator according to the first embodiment.
Figure 14:
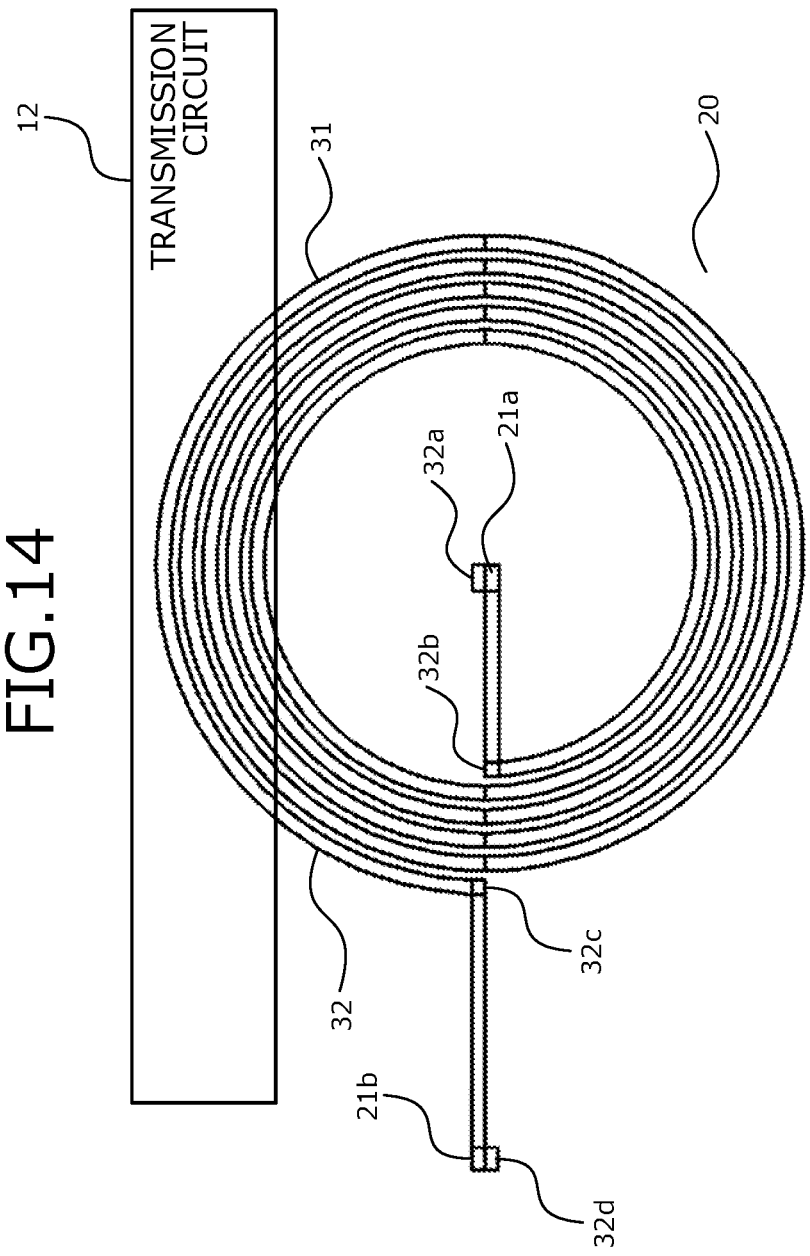
FIG. 14 is a schematic plan view of the horizontal position of the transmission circuit disposed on the isolator according to the first embodiment.
Figure 15:
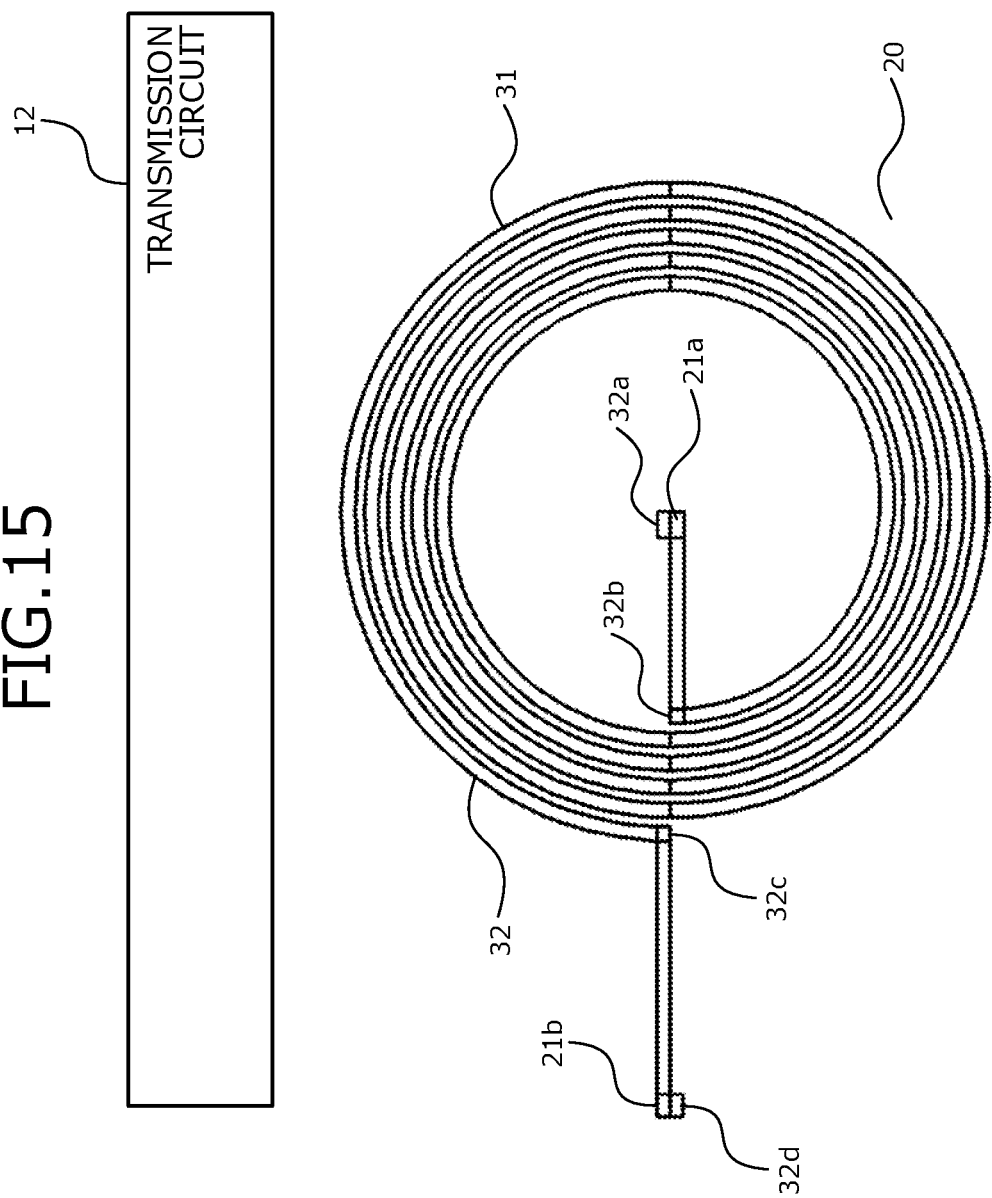
FIG. 15 is a schematic plan view of the horizontal position of the transmission circuit disposed on the isolator according to the first embodiment.

A position of the transmission circuit 12 along a direction (horizontal direction) parallel to the substrate front surface will be described. FIGS. 13 to 15 are schematic plan views of the horizontal position of the transmission circuit disposed on the isolator according to the first embodiment. FIGS. 13 to 15 depict the horizontal position of the transmission circuit 12 relative to the first coil 21. FIGS. 13 to 15 depict only the first coil 21 among the first and second coils 21 and 22 configuring the transformer 13. As depicted in FIG. 13, the transmission circuit 12 may be disposed such that the transmission circuit 12 almost entirely overlaps the first coil 21 in the depth direction. In this case, the chip size may be reduced to a size that barely encompasses the outermost perimeters of the first coil 21 and the second coil 22.

Figure 19:
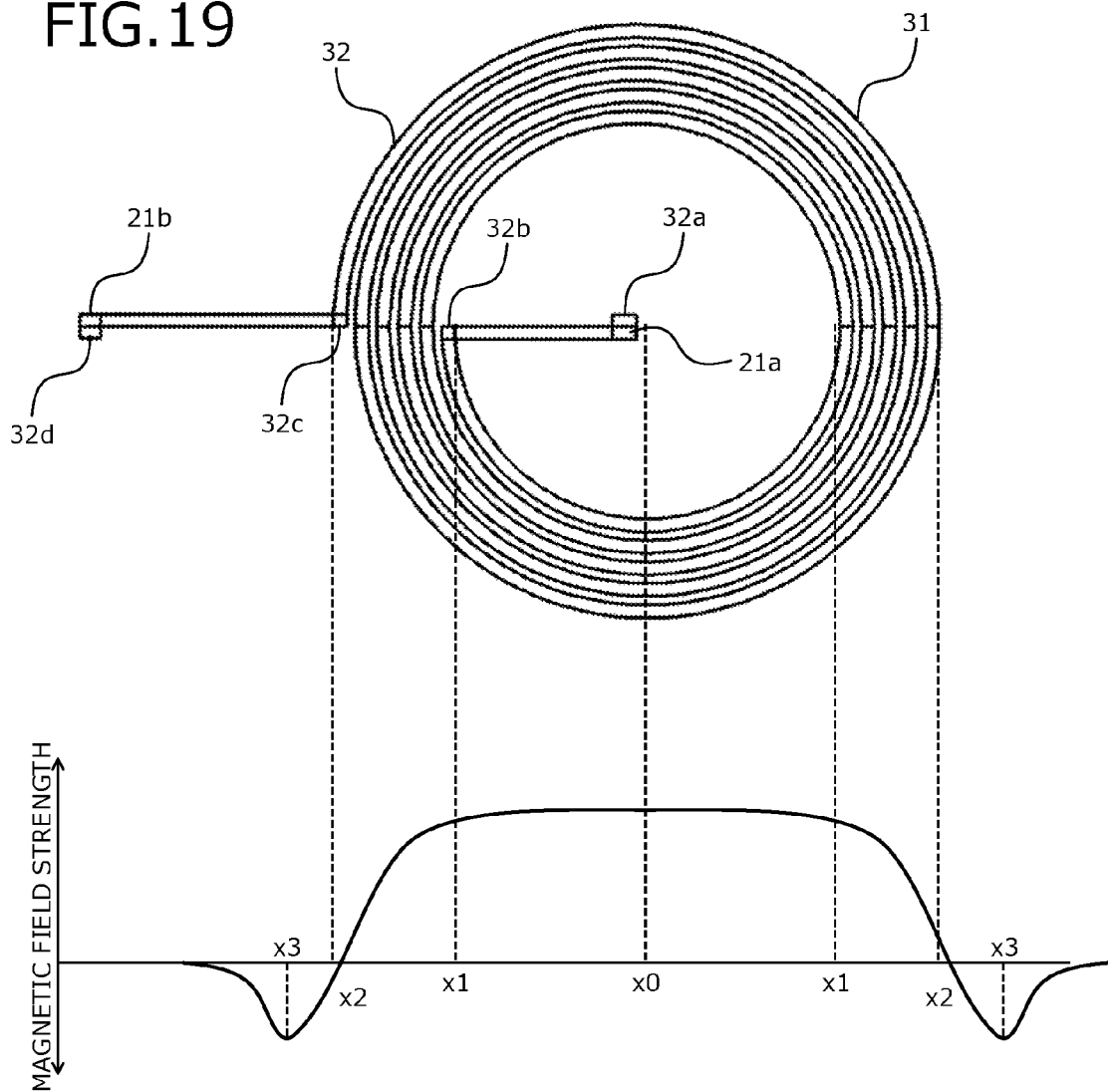
FIG. 19 is a characteristics diagram depicting magnetic field strength distribution of a coil of the isolator according to a fourth embodiment.

The center of the spiral of the coil (the position of the inner end portion 21a of the first coil 21) has the highest magnetic field strength (magnetic flux density) between the first coil 21 and the second coil 22 (see FIG. 19 described later). Therefore, as depicted in FIG. 14, the transmission circuit 12 may be disposed at a position shifted outward from the center of the spiral of the coil so as not to oppose the center of the spiral of the coil in the depth direction. As depicted in FIG. 15, the transmission circuit 12 may be disposed so as not to oppose the coil. By disposing the transmission circuit 12 at a position shifted from the center of the spiral of the coil, the transmission circuit 12 may be prevented from malfunctioning due to magnetic flux of the coil. Although the formation region of the transmission circuit 12 is depicted as a rectangular planar pattern in FIG. 13, configuration is not limited hereto and, for example, the formation region may have a planar pattern of a substantially circular shape, a substantially polygonal shape, or an annular shape.

As described above, according to the first embodiment, by disposing the transmission circuit and a secondary-side coil on the front surface side of the first semiconductor substrate and disposing a primary-side coil on the back surface side of the first semiconductor substrate, the first electrode pads acting as terminals for connecting the secondary-side coil to the reception circuit disposed on the second semiconductor substrate may be formed on the front surface of the first semiconductor substrate. This eliminates the need to form bump electrodes on the first electrode pads, enabling a reduction in the number of processes of the assembly process for mounting the first semiconductor substrate on the mounting substrate. The electrode pads of the first and second semiconductor substrates may be connected electrically by a simple wire bonding process. Therefore, the assembly process for mounting the first and second semiconductor substrates as a single package is simplified and the mounting costs may be reduced. According to the first embodiment, since the transmission circuit may be disposed to oppose the coils in the depth direction, the first semiconductor substrate may be reduced in size to an extent that the outermost perimeters of the coils are barely encompassed, enabling a reduction in size of the isolator.

According to the first embodiment, since the transmission circuit and the reception circuit are integrated to the respective semiconductor substrates, malfunction of the transmission circuit due to dV/dt generated on the reception circuit side may be suppressed. According to the first embodiment, the transformer does not require a magnetic body as a constituent unit and therefore, is not limited by operation frequency characteristics consequent to the hysteresis of the magnetic body. Thus, the electrical characteristics of the isolator may be improved. According to the first embodiment, since the first coil (primary-side coil) is configured by the layered metal film embedded within the coil trench, the cross-sectional area of the primary-side coil may be made larger depending on the depth of the coil trench. As a result, the direct current resistance of the primary-side coil may be reduced and high voltage gain may be obtained. Since the operation resistance of the primary-side coil may be reduced, this is useful for a driver IC (see FIG. 1) for gate driving of a MOSFET, for example.

According to the first embodiment, Since the first coil (primary-side coil) and the second coil (secondary-side coil) are formed on the back surface side and the front surface side, respectively, of the first semiconductor substrate, the coils do not oppose each other on the trench side wall surfaces as in the case of a conventional transformer having respective coils formed within two trenches. Therefore, the area of the opposing portions of the primary-side coil and the secondary-side coil may be made smaller as compared to a conventional transformer, and the parasitic capacitance between the coils may be reduced. As a result, the delay time of signal transfer from the transmission circuit to the reception circuit may be shortened and the electrical characteristics of the isolator may be improved. By changing the thickness of the first semiconductor substrate, the depth of the coil trench, and the thickness of the insulating layer on the substrate front surface, the thickness of the portion between the primary-side coil and the secondary-side coil may be increased easily. Therefore, a higher breakdown voltage may be achieved.

Figure 16:
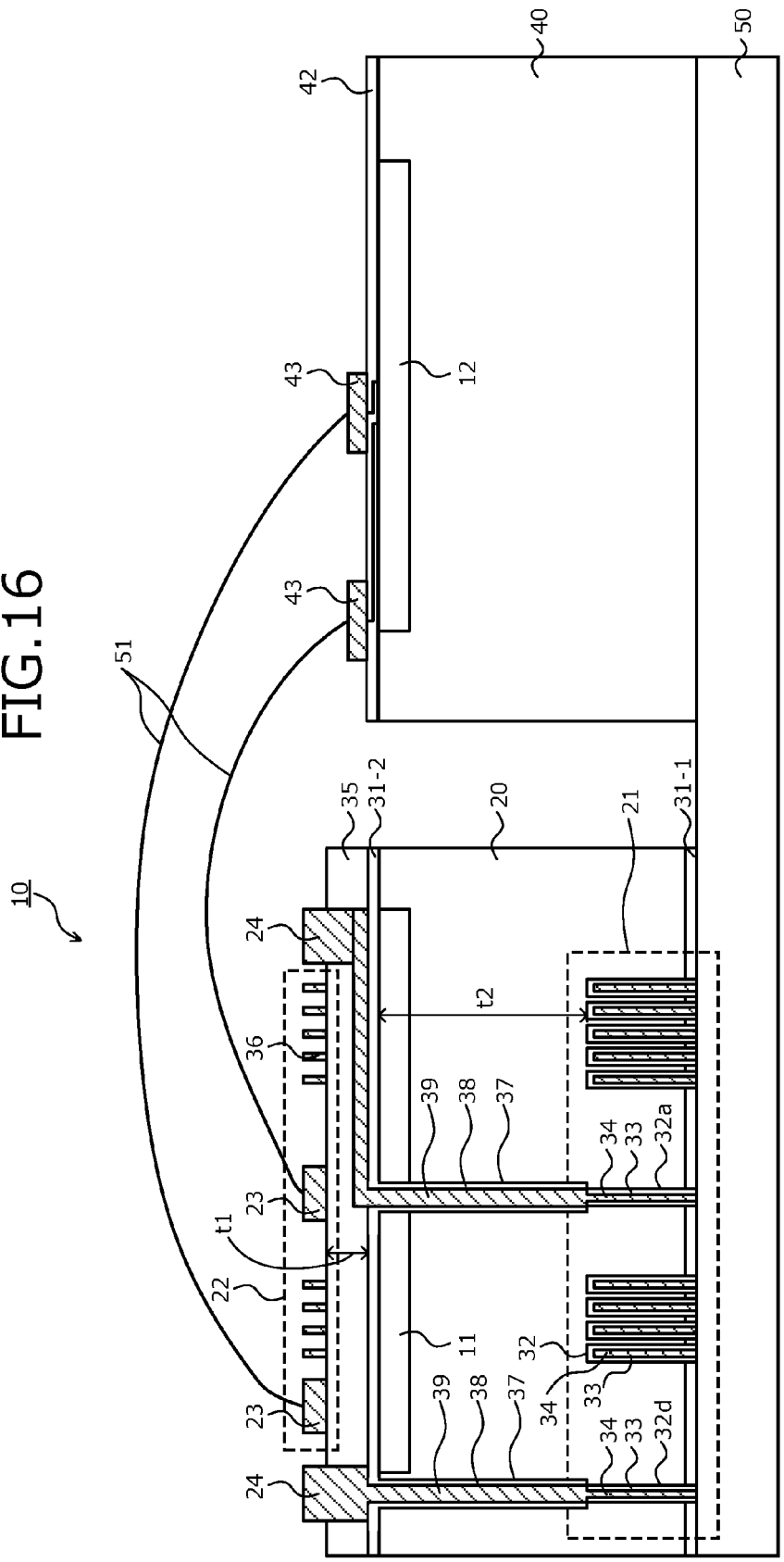
FIG. 16 is a schematic cross-sectional view of a portion of a semiconductor apparatus to which the isolator according to a second embodiment is applied.

The isolator according to a second embodiment will be described. FIG. 16 is a schematic cross-sectional view of a portion of a semiconductor apparatus to which the isolator according to the second embodiment is applied. The isolator according to the second embodiment is different from the isolator according to the first embodiment in that the positions of the transmission circuit 12 and the reception circuit 11 are interchanged with each other. In particular, the reception circuit 11 is disposed on the first semiconductor substrate 20 and the transmission circuit 12 is disposed on the second semiconductor substrate 40. The second electrode pads 24 are connected to the reception circuit 11 on the front surface side of the first semiconductor substrate 20 via contact holes penetrating the insulating layer 35 in the depth direction. The first electrode pads 23 are connected electrically by bonding wires 52 to the third electrode pads 43 disposed on the front surface of the second semiconductor substrate 40. The third electrode pads 43 are connected to the transmission circuit 12 on the front surface side of the second semiconductor substrate 40. Therefore, the signal from the transmission circuit 12 is input via the bonding wires 52 to the second coil 22 and is input from the first coil 21 to the reception circuit 11.

According to the second embodiment, since the first coil (secondary-side coil) and the second coil (primary-side coil) are formed on the back surface side and the front surface side, respectively, of the first semiconductor substrate, the coils do not oppose each other on the trench side wall surfaces as in the case of a conventional transformer having respective coils formed within two trenches. Therefore, the area of the opposing portions of the primary-side coil and the secondary-side coil may be made smaller as compared to a conventional transformer, and the parasitic capacitance between the coils may be reduced. As a result, the delay time of signal transfer from the transmission circuit to the reception circuit may be shortened and the electrical characteristics of the isolator may be improved. By changing the thickness of the first semiconductor substrate, the depth of the coil trench, and the thickness of the insulating layer on the substrate front surface, the thickness of the portion between the primary-side coil and the secondary-side coil may be increased easily. Therefore, higher breakdown voltage may be achieved.

Figure 17:
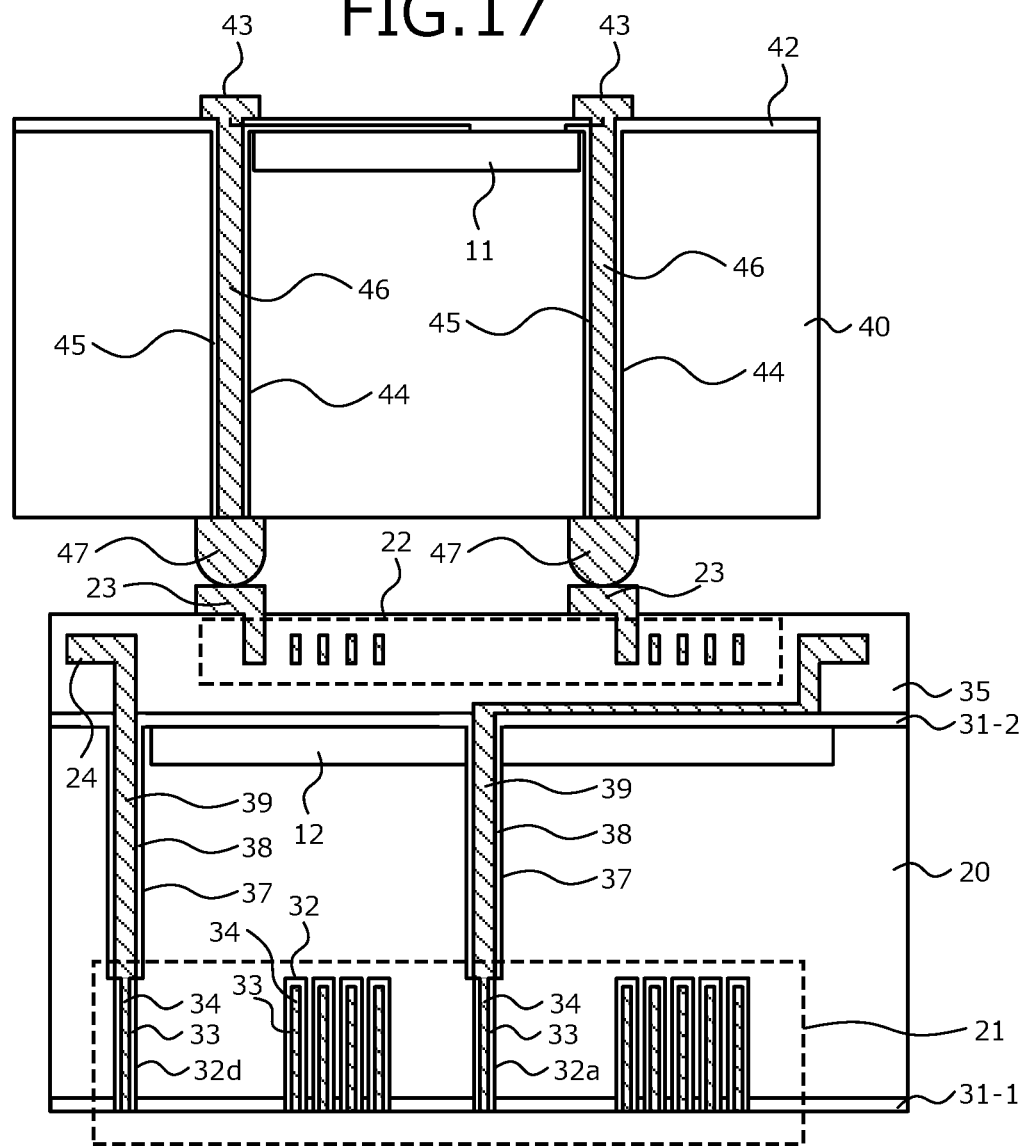
FIG. 17 is a schematic cross-sectional view of a portion of a semiconductor apparatus to which the isolator according to a third embodiment is applied.

The isolator according to a third embodiment will be described. FIG. 17 is a schematic cross-sectional view of a portion of a semiconductor apparatus to which the isolator according to the third embodiment is applied. The isolator according to the third embodiment is different from the isolator according to the first embodiment in that the second semiconductor substrate 40 is disposed on the first semiconductor substrate 20 to connect the second coil 22 of the first semiconductor substrate 20 and the reception circuit 11 of the second semiconductor substrate 40 without using a bonding wire. In particular, a chip-on-chip (COC) technique is used for fabricating the isolator so as to achieve a reduction in size of the isolator.

For example, as depicted in FIG. 17, the second semiconductor substrate 40 has a smaller chip size than the first semiconductor substrate 20. The second semiconductor substrate 40 is disposed with two via trenches 44 having a depth reaching the back surface from the front surface. The via trenches 44 are via holes for leading out electrode portions of the device configuring the reception circuit 11 disposed on the substrate front surface side to the substrate back surface side. Within the via trenches 44, insulating films 45 are disposed along the side walls of the via trenches 44 with embedded via-metal-films 46 disposed inside the insulating films 45. The two embedded via-metal-films 46 are electrically isolated from each other by the insulating films 45. The two embedded via-metal-films 46 are connected to the respective third electrode pads 43 on the substrate front surface side.

On the back surface of the second semiconductor substrate 40, bump electrodes 47 are disposed to be in contact with lower end portions (end portions on the substrate back surface side) of the embedded via-metal-films 46. Therefore, the electrode portions of the device configuring the reception circuit 11 are led out through the embedded via-metal-films 46 and the bump electrodes 47, to the back surface of the second semiconductor substrate 40. The second semiconductor substrate 40 is placed with the back surface facing downward on the front surface of the first semiconductor substrate 20. The bump electrodes 47 of the second semiconductor substrate 40 are joined to the first electrode pads 23 exposed on the front surface of the first semiconductor substrate 20. When the second semiconductor substrate 40 is disposed with the back surface facing downward on the first semiconductor substrate 20, the electrode portions (electrode pads) of the reception circuit 11 are exposed on the front surface of the second semiconductor substrate 40, the front surface not opposing the first semiconductor substrate 20. Therefore, the wire bonding may be achieved between the reception circuit 11 and the first MOSFET 1 of the upper arm of the bridge circuit 3 on the front surface of the second semiconductor substrate 40, the front surface not opposing the first semiconductor substrate 20. The first semiconductor substrate 20 has the same configuration as in the first embodiment except that the second coil 22 and the second electrode pads 24 are covered with the insulating layer 35 to expose only the first electrode pads 23 on the outermost surface.

Figure 18:
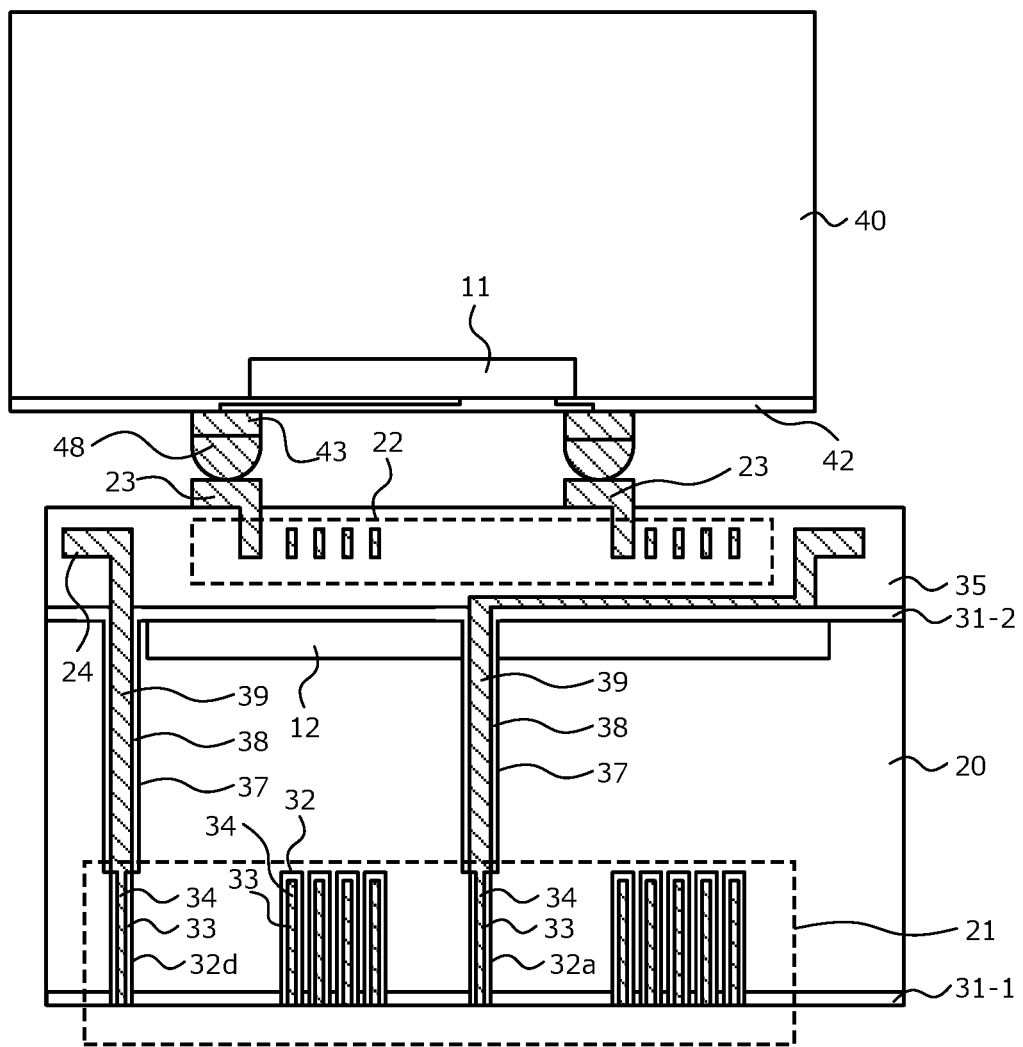
FIG. 18 is a schematic cross-sectional view of a portion of another example of a semiconductor apparatus to which the isolator according to the third embodiment is applied.

FIG. 18 is a schematic cross-sectional view of a portion of another example of a semiconductor apparatus to which the isolator according to the third embodiment is applied. As depicted in FIG. 18, the second semiconductor substrate 40 may be disposed with the front surface facing downward on the first semiconductor substrate 20. In this case, bump electrodes 48 are disposed on the third electrode pads 43 of the front surface of the second semiconductor substrate 40. The second semiconductor substrate 40 is placed with the front surface facing downward on the front surface of the first semiconductor substrate 20. The bump electrodes 48 of the second semiconductor substrate 40 are joined to the first electrode pads 23 exposed on the front surface of the first semiconductor substrate 20. When the second semiconductor substrate 40 is disposed with the front surface facing downward on the first semiconductor substrate 20, the electrode portions of the reception circuit 11 may be led out to the substrate back surface through embedded via-metal-films (not depicted) disposed within via holes that penetrate the second semiconductor substrate 40, for example. Therefore, the wire bonding may be achieved between the reception circuit 11 and the first MOSFET 1 of the upper arm of the bridge circuit 3 on the back surface of the second semiconductor substrate 40, the back surface not opposing the first semiconductor substrate 20. The first semiconductor substrate 20 has the same configuration as the isolator depicted in FIG. 17.

The third embodiment may be applied to the second embodiment to interchange the positions of the transmission circuit 12 and the reception circuit 11 with each other.

According to the third embodiment, the same effects achieved by the first and second embodiments may be obtained even when the second semiconductor substrate is disposed on the first semiconductor substrate.

Figure 20:
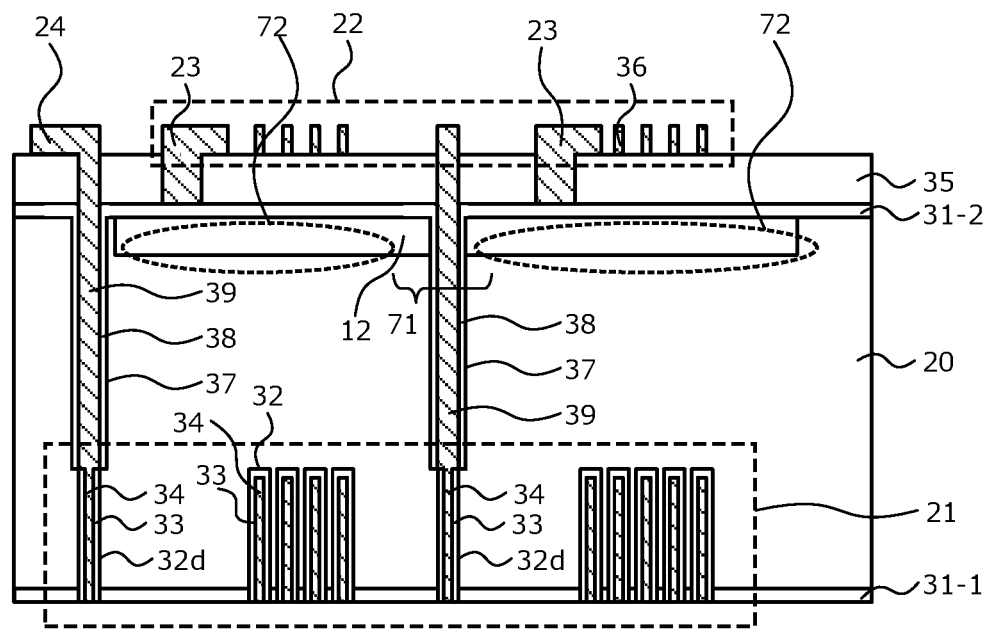
FIG. 20 is a schematic cross-sectional view of a portion of a semiconductor apparatus to which the isolator according to the fourth embodiment is applied.
Figure 21:
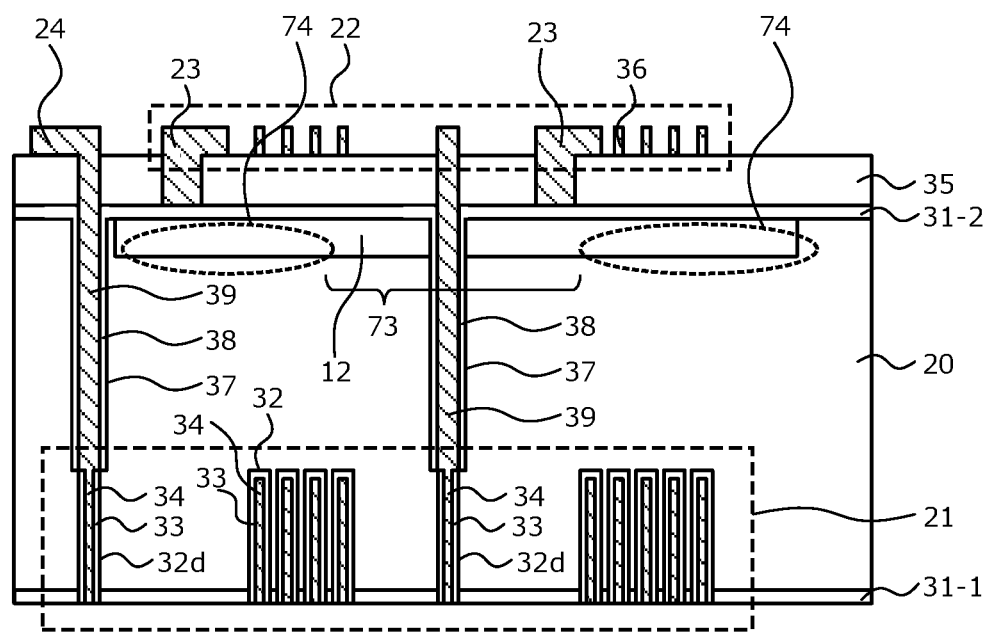
FIG. 21 is a schematic cross-sectional view of a portion of the semiconductor apparatus to which the isolator according to the fourth embodiment is applied.
Figure 22:
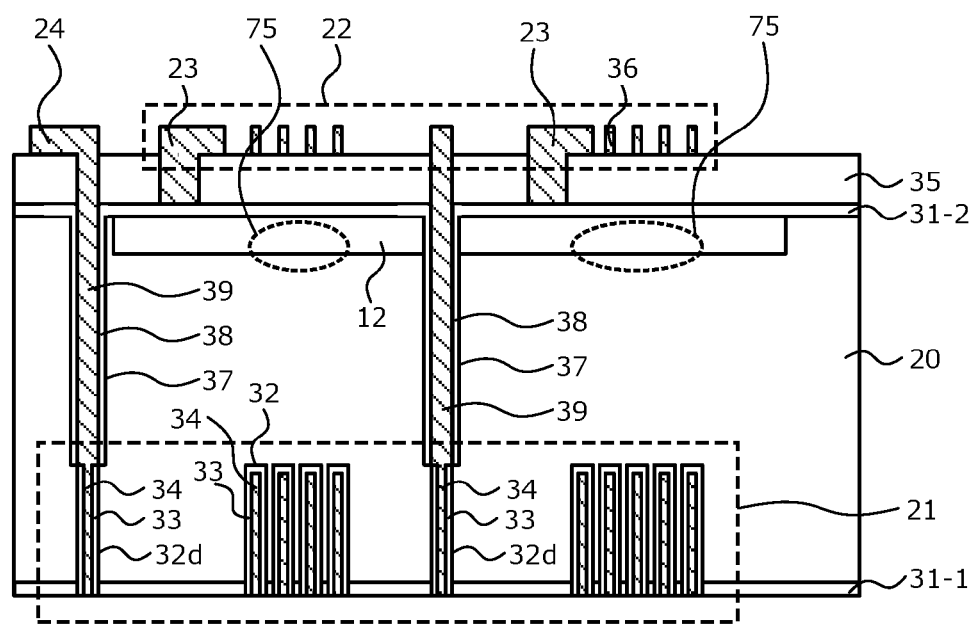
FIG. 22 is a schematic cross-sectional view of a portion of the semiconductor apparatus to which the isolator according to the fourth embodiment is applied.

The isolator according to a fourth embodiment will be described in terms of arrangement of a circuit unit (the transmission circuit 12 and the reception circuit 11) disposed on the same first semiconductor substrate 20 as the transformer 13. FIG. 19 is a characteristics diagram depicting magnetic field strength distribution of a coil of the isolator according to the fourth embodiment. FIGS. 20 to 22 are schematic cross-sectional views of a portion of a semiconductor apparatus to which the isolator according to the fourth embodiment is applied. FIG. 19 depicts only the first coil 21 among the coils (the first coil 21 and the second coil 22) configuring the transformer 13. As depicted in FIG. 19, the magnetic flux (positive magnetic flux) is strongest at the center x0 of the spiral of the coil (the position of the inner end portion 21a of the first coil 21). Inward from an innermost circumference x1 of the coil (x1-x0-x1), the magnetic flux gradually attenuates as the distance from the center x0 of the spiral increases and the magnetic field strength may be considered as being substantially constant. On the other hand, on the turns of the coil (x1-x2), the magnetic flux significantly attenuates from the innermost circumference x1 of the coil outward. In a vicinity x3 of the coil, outward from the outermost circumference x2 of the coil, the magnetic flux in the opposite direction (negative magnetic flux) becomes stronger.

Therefore, among the circuit units configuring the transmission circuit 12 and the reception circuit 11 (hereinafter simply referred to as circuits) disposed on the front surface side of the first semiconductor substrate 20, a circuit unit prone to malfunctioning consequent to at least the magnetic flux of the coil may be disposed in a portion minimally affected by the magnetic flux of the coil in a circuit formation region. The circuit unit prone to malfunctioning due to the magnetic flux of the coil may be a circuit operating at low voltage and low current, for example. A circuit operating at low voltage and low current is easily affected by noise due to the magnetic flux of the coil and may malfunction if magnetic flux perpendicular to the direction of current flow becomes strong. A circuit operating at low voltage may be a voltage comparison circuit using a comparator. The voltage comparison circuit uses a comparator to compare a signal with a reference voltage that is lower than a source voltage, and is sensitive to noise. If these element circuits are operated at low current so as to suppress consumption current, the circuits become more sensitive to noise. In particular, for example, portions 72, 74, and 75 described below are portions minimally affected by the magnetic flux of the coil and may be used for disposing the circuit units prone to malfunctioning consequent to at least the magnetic flux of the coil. In FIGS. 20 to 22, the transmission circuit 12 is depicted as a circuit disposed in the circuit formation region.

As depicted in FIG. 20, a circuit unit prone to malfunctioning due to the magnetic flux of the coil is not disposed in a portion 71 opposing in the depth direction, the center x0 of the spiral of the coil in the circuit formation region. Therefore, a circuit unit prone to malfunctioning due to the magnetic flux of the coil is disposed in a portion 72 other than the portion 71 opposing in the depth direction, the center x0 of the spiral of the coil in the circuit formation region. Additionally, as depicted in FIG. 21, a circuit unit prone to malfunctioning due to the magnetic flux of the coil is not disposed in a portion 73 opposing in the depth direction, a portion inward from the innermost circumference x1 of the coil (x1-x0-x1) in the circuit formation region. Therefore, a circuit unit prone to malfunctioning due to the magnetic flux of the coil is disposed in a portion 74 opposing in the depth direction, a portion outward from the innermost circumference x1 of the coil in the circuit formation region. Moreover, as depicted in FIG. 22, a circuit unit prone to malfunctioning due to the magnetic flux of the coil may be disposed in a portion 75 opposing in the depth direction, a portion outward from the innermost circumference x1 and inward from the outermost circumference x2 of the coil (x1-x2), in the circuit formation region. Therefore, a circuit unit prone to malfunctioning due to the magnetic flux of the coil may oppose only the turns of the coil causing the least malfunctioning due to the magnetic flux of the coil. The entire circuit may be disposed in a portion minimally affected by the magnetic flux of the coil.

The fourth embodiment may be applied to the second embodiment to interchange the positions of the transmission circuit 12 and the reception circuit 11 with each other. The fourth embodiment may be applied to the third embodiment to connect the second coil 22 of the first semiconductor substrate 20 to the circuit of the second semiconductor substrate 40 without using a bonding wire.

As described above, according to the fourth embodiment, the same effects as in the first to third embodiments may be obtained.

Figure 23:
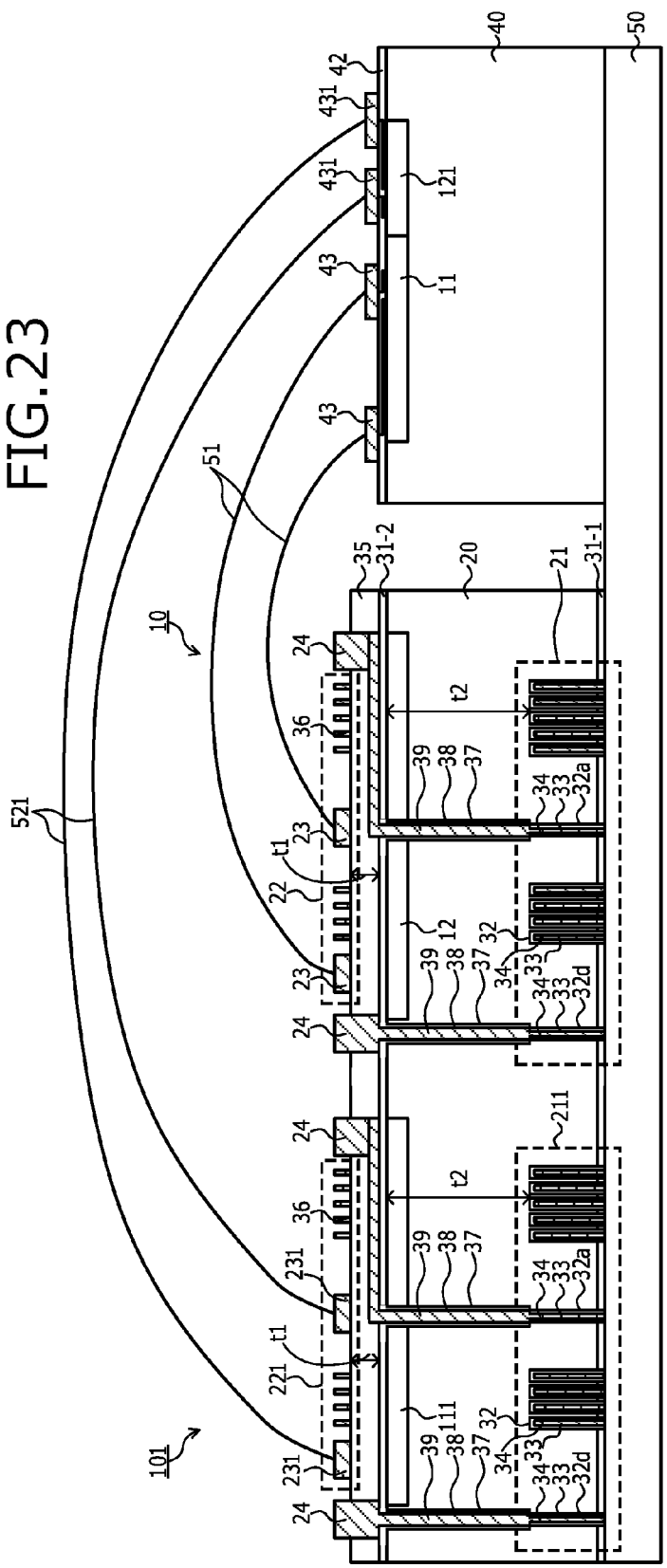
FIG. 23 is a schematic cross-sectional view of a portion of a semiconductor apparatus to which the isolator according to a fifth embodiment is applied.

The isolator according to a fifth embodiment will be described. FIG. 23 is a schematic cross-sectional view of a portion of a semiconductor apparatus to which the isolator according to the fifth embodiment is applied. The isolator according to the fifth embodiment is different from the isolator according to the first embodiment in the following two points. A first difference is that a third coil 211 and a fourth coil 221 are further included in the first semiconductor substrate 20. A second difference is that a second reception circuit 111 is further included in the first semiconductor substrate 20 and a second transmission circuit 121 is further included in the second semiconductor substrate 40. The second reception circuit 111 need not have a drive circuit function and the second transmission circuit 121 need not have a signal control circuit function, and the both circuits may have a function of only transferring a signal. As is the case with the second embodiment, the third coil 211 and the second reception circuit 111 are connected, and the fourth coil 221 and the second transmission circuit 121 are connected.

Fourth electrode pads 231 are electrically connected by bonding wires 521 to fifth electrode pads 431 disposed on the front surface of the second semiconductor substrate 40. The fifth electrode pads 431 are connected to the second transmission circuit 121 on the front surface side of the second semiconductor substrate 40. Therefore, the signal from the second transmission circuit 121 is input via the bonding wires 521 to the fourth coil 221 and is input from the third coil 211 to the second reception circuit 111. Thus, an isolator 101 according to the fifth embodiment may bi-directionally transmit and receive signals. The configuration of the third coil 211 is the same as that of the first coil 21 and is led out through the embedded via-metal-films 39 to the substrate front surface. The configuration of the fourth coil 221 is the same as that of the second coil 22. The third coil 211 and the fourth coil 221 oppose each other across the insulating layer 35 and the first semiconductor substrate 20 to configure a transformer. The first transmission circuit and the first reception circuit are the transmission circuit 12 disposed on the first semiconductor substrate 20 and the reception circuit 11 located on the second semiconductor substrate 40, respectively.

In the description, the present invention is not limited to the embodiments described above and may modified without departing from the spirit of the present invention. For example, the number of turns and the dimensions of the primary-side coils and the secondary-side coil may be changed according to the configuration of the isolator. Although the embodiments described above have been described by taking as an example, a case where the first semiconductor substrate on which the transmission circuit is disposed and the second semiconductor substrate on which the reception circuit is disposed are integrated to a single mounting substrate, another component may be further integrated to the single mounting substrate. For example, the present invention is applicable to a so-called intelligent power module (IPM) having not only the first semiconductor substrate on which the transmission circuit is disposed, the second semiconductor substrate on which the reception circuit is disposed, and the MOSFETs configuring the bridge circuit but also other various components integrated to the single mounting substrate. Although the plane direction of the front surfaces of the semiconductor substrates is the <100> plane in the embodiments described above, the plane direction of the front surfaces of the semiconductor substrates may be changed. Although the embodiments described above are described by using P-type semiconductor substrates, the present invention is applicable to n-type semiconductor substrates or semiconductor substrates made of material other than silicon.

According to the invention described above, by disposing the first circuit and the second coil on the second principal surface side of the first semiconductor substrate and disposing the first coil on the first principal surface side of the first semiconductor substrate, the electrode pad acting as a terminal connecting the second coil to the second circuit disposed on the second semiconductor substrate may be formed on the front surface of the first semiconductor substrate. This eliminates the need to form a bump electrode on the first electrode pad and the number of processes may be reduced in the assembly process for mounting the first semiconductor substrate on a mounting substrate. The electrode pads of the first and second semiconductor substrates may be electrically connected by a simple wire bonding process.

The isolator and the isolator manufacturing method according to the present invention produces an effect that the number of processes of the package assembly process may be simplified.

As described above, the isolator and the isolator manufacturing method according to the present invention are useful for a power semiconductor apparatus required to ensure electrical insulation in electronic devices controlled by high voltage such as industrial and medical devices.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An isolator, comprising:
   a first semiconductor substrate and a second semiconductor substrate;
   a first coil disposed on a first principal surface side of the first semiconductor substrate, the first coil being configured by:
   a trench disposed in the first principal surface of the first semiconductor substrate,
   an oxide film disposed along a side wall and a bottom surface of the trench, and
   a first metal film embedded inside the oxide film within the trench;
   a first circuit disposed on a second principal surface side of the first semiconductor substrate;
   a second coil disposed on the second principal surface side of the first semiconductor substrate and opposing the first coil across the first semiconductor substrate;
   a second circuit disposed on a second principal surface side of the second semiconductor substrate; and
   a transformer configured by the first coil and the second coil, and transferring a signal between the first circuit and the second circuit from the first circuit to the second circuit or from the second circuit to the first circuit in an electrically isolated state.

2. The isolator of claim 1, further comprising a via hole reaching the trench from the second principal surface of the first semiconductor substrate, wherein
   the oxide film is disposed along a side wall of the via hole, and
   the first metal film is embedded inside the oxide film within the via hole, and
   a signal from the first circuit or the second circuit is input to the first coil, through the first metal film within the via hole.

3. The isolator of claim 1, wherein the first metal film is a plated film.

4. The isolator of claim 1, further comprising an insulating layer disposed on the second principal surface of the first semiconductor substrate to cover the first circuit, wherein the second coil is configured by a second metal film disposed on the insulating layer.

5. The isolator of claim 4, wherein the second metal film is a plated film.

6. An isolator, comprising:
   a first semiconductor substrate and a second semiconductor substrate;
   a first coil disposed on a first principal surface side of the first semiconductor substrate;
   a first circuit disposed on a second principal surface side of the first semiconductor substrate;
   a second coil disposed on the second principal surface side of the first semiconductor substrate and opposing the first coil across the first semiconductor substrate;
   a second circuit disposed on a second principal surface side of the second semiconductor substrate; and
   a transformer configured by the first coil and the second coil, and transferring a signal between the first circuit and the second circuit from the first circuit to the second circuit or from the second circuit to the first circuit in an electrically isolated state, wherein
   the first circuit opposes the first coil and the second coil in a depth direction,
   the first coil and the second coil have a planar spiral shape, and
   the first circuit includes a circuit unit prone to malfunctioning consequent to at least magnetic flux of one of the first coil and the second coil opposes in the depth direction, the first coil and the second coil in a portion other than centers of spirals of the first coil and the second coil.

7. The isolator of claim 6, wherein in the first circuit, the circuit unit prone to malfunctioning consequent to at least magnetic flux of the one coil opposes the first coil and the second coil in the depth direction, at a position outward from innermost circumferences of the spirals of the first coil and the second coil.

8. The isolator of claim 7, wherein in the first circuit, the circuit unit prone to malfunctioning consequent to at least magnetic flux of the one coil opposes in the depth direction, a portion outward from the innermost circumferences and inward from outermost circumferences of the spirals of the first coil and the second coil.

9. An isolator, comprising:
a first semiconductor substrate and a second semiconductor substrate;
a first coil disposed on a first principal surface side of the first semiconductor substrate;
a first circuit disposed on a second principal surface side of the first semiconductor substrate;
a second coil disposed on the second principal surface side of the first semiconductor substrate and opposing the first coil across the first semiconductor substrate;
a second circuit disposed on a second principal surface side of the second semiconductor substrate;
a transformer configured by the first coil and the second coil, and transferring a signal between the first circuit and the second circuit from the first circuit to the second circuit or from the second circuit to the first circuit in an electrically isolated state; and
a single mounting substrate on which are mounted the first semiconductor substrate and the second semiconductor substrate.

10. An isolator, comprising:
a first semiconductor substrate and a second semiconductor substrate;
a first coil disposed on a first principal surface side of the first semiconductor substrate;
a first circuit disposed on a second principal surface side of the first semiconductor substrate;
a second coil disposed on the second principal surface side of the first semiconductor substrate and opposing the first coil across the first semiconductor substrate;
a second circuit disposed on a second principal surface side of the second semiconductor substrate;
a transformer configured by the first coil and the second coil, and transferring a signal between the first circuit and the second circuit from the first circuit to the second circuit or from the second circuit to the first circuit in an electrically isolated state,
wherein the second circuit has an electrode portion on the second principal surface side of the first semiconductor substrate connected by a wire to one of the first coil and the second coil.

11. The isolator of claim 10, wherein
the first circuit is a transmission circuit,
the second circuit is a reception circuit, and
a signal from the first circuit is input to the first coil and input from the second coil through the wire to the second circuit.

12. The isolator of claim 10, wherein
the first circuit is a reception circuit,
the second circuit is a transmission circuit, and
a signal from the second circuit is input to the second coil through the wire and input from the second coil to the first circuit.

13. An isolator comprising:
a first semiconductor substrate; and
a second semiconductor substrate that is free of direct contact with the first semiconductor substrate;
a first coil disposed on a first principal surface side of the first semiconductor substrate;
a first circuit disposed on a second principal surface side of the first semiconductor substrate;
a second coil disposed on the second principal surface side of the first semiconductor substrate and opposing the first coil across the first semiconductor substrate;
a second circuit disposed on a second principal surface side of the second semiconductor substrate; and
a transformer configured by the first coil and the second coil, and transferring a signal between the first circuit and the second circuit from the first circuit to the second circuit or from the second circuit to the first circuit in an electrically isolated state.

14. A method of manufacturing an isolator including a first coil disposed on a first principal surface side of a first semiconductor substrate, a first circuit disposed on a second principal surface side of the first semiconductor substrate, a second coil disposed on the second principal surface side of the first semiconductor substrate and opposing the first coil across the first semiconductor substrate, a second circuit disposed on a second principal surface side of a second semiconductor substrate, and a transformer configured by the first coil and the second coil and transferring a signal between the first circuit and the second circuit from the first circuit to the second circuit or from the second circuit to the first circuit in an electrically isolated state, the isolator manufacturing method comprising:
forming the first circuit on the second principal surface of the first semiconductor substrate;
forming a via hole in the second principal surface of the first semiconductor substrate and forming a trench in the first principal surface of the first semiconductor substrate so as to connect the via hole and the trench;
forming an oxide film along a side wall of the via hole and a side wall and a bottom surface of the trench;
forming the first coil and a terminal of the first coil by embedding a first metal film inside the oxide film within the via hole and the trench such that the first metal film is exposed on the first principal surface and the second principal surface of the first semiconductor substrate;
forming an insulating layer on the second principal surface of the first semiconductor substrate so as to cover the first circuit;
forming a second metal film forming the second coil on a surface of the insulating layer; and
forming the second circuit on the second principal surface side of the second semiconductor substrate.

15. The method of claim 14, wherein the first metal film is embedded inside the oxide film within the via hole and the trench by a plating process.

16. The manufacturing method of claim 14, wherein forming a second metal film includes
forming a mask opened in a planar pattern of the second coil on a surface of the insulating layer,
filling an opening portion of the mask with the second metal film by a plating process, and
removing the mask from the surface of the insulating layer.

17. The method of claim 14, further comprising mounting on a single mounting substrate, the first semiconductor substrate and the second semiconductor substrate.

18. The manufacturing method of claim 14, further comprising electrically connecting one of the first coil and the second coil to an electrode portion of the second circuit by wire on the second principal surface side of the first semiconductor substrate.

* * * * *